(12) United States Patent
Jean et al.

(10) Patent No.: US 11,502,221 B2
(45) Date of Patent: Nov. 15, 2022

(54) SEMICONDUCTOR LIGHT-EMITTING DEVICE INCLUDING BUFFER STRUCTURE

(71) Applicant: SAMSUNG ELECTRONICS CO., LTD., Suwon-si (KR)

(72) Inventors: Jaiwon Jean, Seoul (KR); Joongseo Kang, Seoul (KR); Namsung Kim, Hwaseong-si (KR); Daemyung Chun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 151 days.

(21) Appl. No.: 17/117,298

(22) Filed: Dec. 10, 2020

(65) Prior Publication Data

US 2021/0367102 A1 Nov. 25, 2021

(30) Foreign Application Priority Data

May 25, 2020 (KR) ........................ 10-2020-0062653

(51) Int. Cl.
| | | |
|---|---|---|
| *H01L 33/12* | (2010.01) | |
| *H01L 33/22* | (2010.01) | |
| *H01L 27/15* | (2006.01) | |
| *H01L 33/32* | (2010.01) | |
| *H01L 33/44* | (2010.01) | |
| *H01L 33/38* | (2010.01) | |

(52) U.S. Cl.
CPC ............ *H01L 33/12* (2013.01); *H01L 27/156* (2013.01); *H01L 33/22* (2013.01); *H01L 33/32* (2013.01); *H01L 33/382* (2013.01); *H01L 33/44* (2013.01)

(58) Field of Classification Search
CPC ........ H01L 33/12; H01L 33/22; H01L 27/156; H01L 25/0753; H01L 33/08; H01L 33/382
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |

(Continued)

FOREIGN PATENT DOCUMENTS

| | | |
|---|---|---|
| JP | 2011-23677 A | 2/2011 |
| KR | 10-2014-0020028 A | 2/2014 |

(Continued)

*Primary Examiner* — Savitri Mulpuri
(74) *Attorney, Agent, or Firm* — Sughrue Mion, PLLC

(57) ABSTRACT

A semiconductor light-emitting device includes a buffer structure, a first-type semiconductor layer on the buffer structure, an active layer on the first-type semiconductor layer, and a second-type semiconductor layer on the active layer. The buffer structure includes a nucleation layer, a first dislocation-removing structure on the nucleation layer, and a buffer layer on the first dislocation-removing structure. The first dislocation-removing structure includes a first material layer on the nucleation layer and a second material layer on the first material layer. The second material layer has a lattice constant different from a lattice constant of the first material layer. A roughness of a top surface of the first material layer is higher than a roughness of a top surface of the nucleation layer and higher than a roughness of a top surface of the second material layer.

10 Claims, 37 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,759,853 B2 | 6/2014 | Nam et al. |
| 8,766,295 B2 | 7/2014 | Kim |
| 9,029,911 B2 | 5/2015 | Jang et al. |
| 9,337,381 B2 | 5/2016 | Kim et al. |
| 9,831,378 B2 * | 11/2017 | Lee .................. H01L 33/12 |
| 10,553,749 B2 * | 2/2020 | Lin .................. H01L 21/0243 |
| 2013/0037819 A1 * | 2/2013 | Jang .................. H01L 33/32 |
| | | 257/E33.028 |
| 2020/0176633 A1 | 6/2020 | Hiramatsu et al. |

FOREIGN PATENT DOCUMENTS

| | | |
|---|---|---|
| KR | 10-2015-0040630 A | 4/2015 |
| KR | 10-1851206 B1 | 4/2018 |
| KR | 10-1864195 B1 | 6/2018 |
| KR | 10-2019-0113695 A | 10/2019 |
| KR | 10-2020-0035428 A | 4/2020 |

* cited by examiner

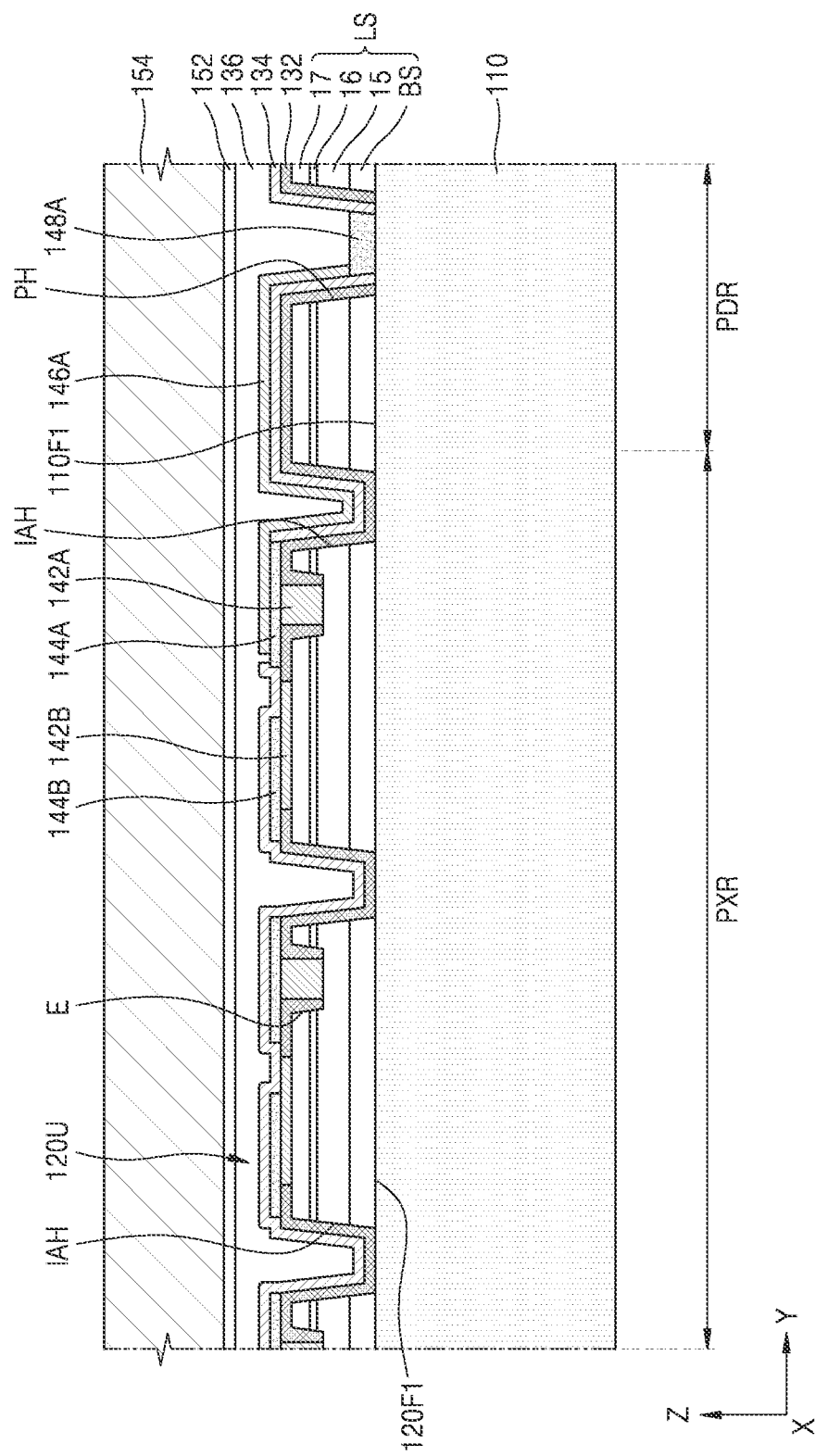

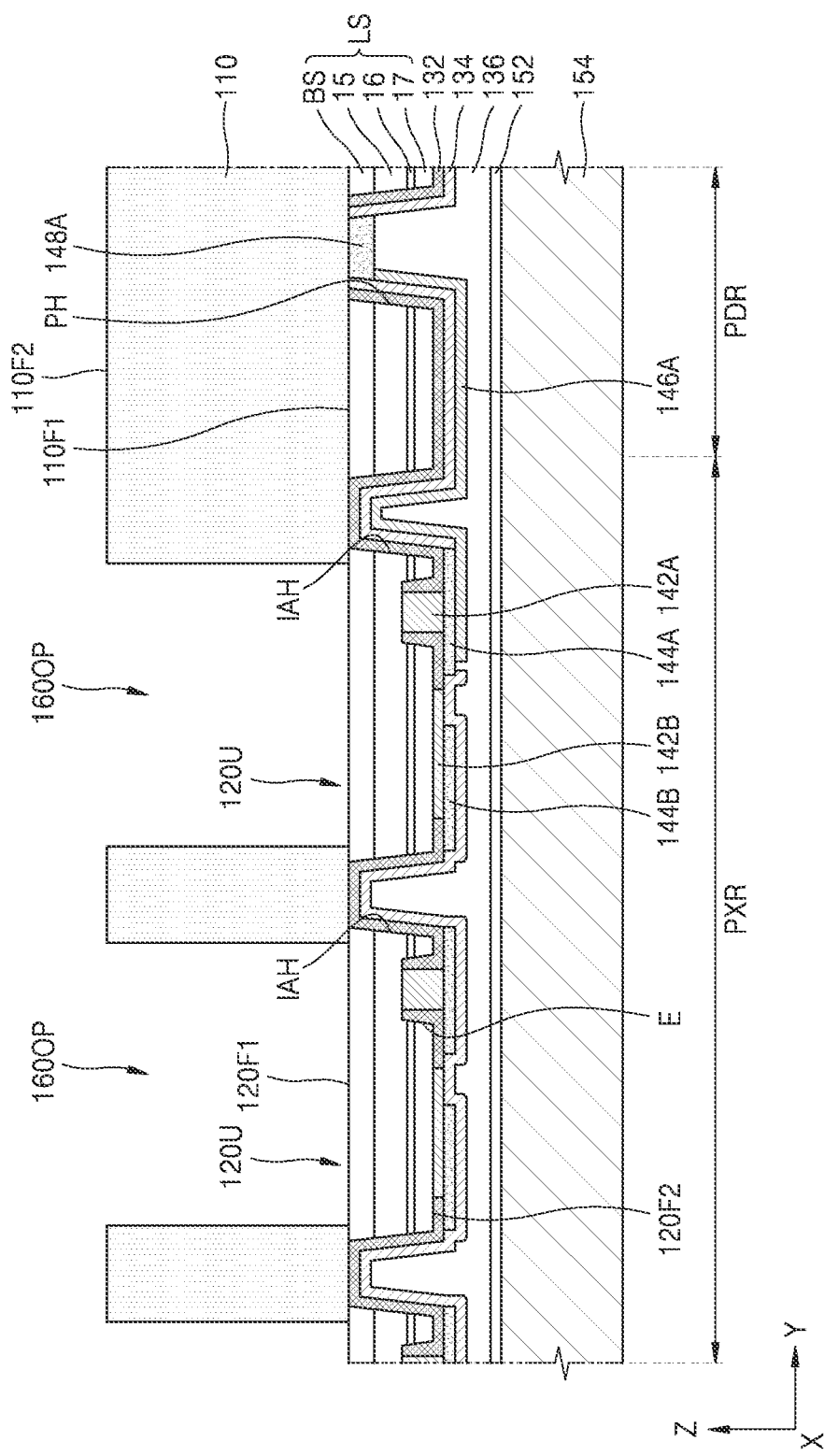

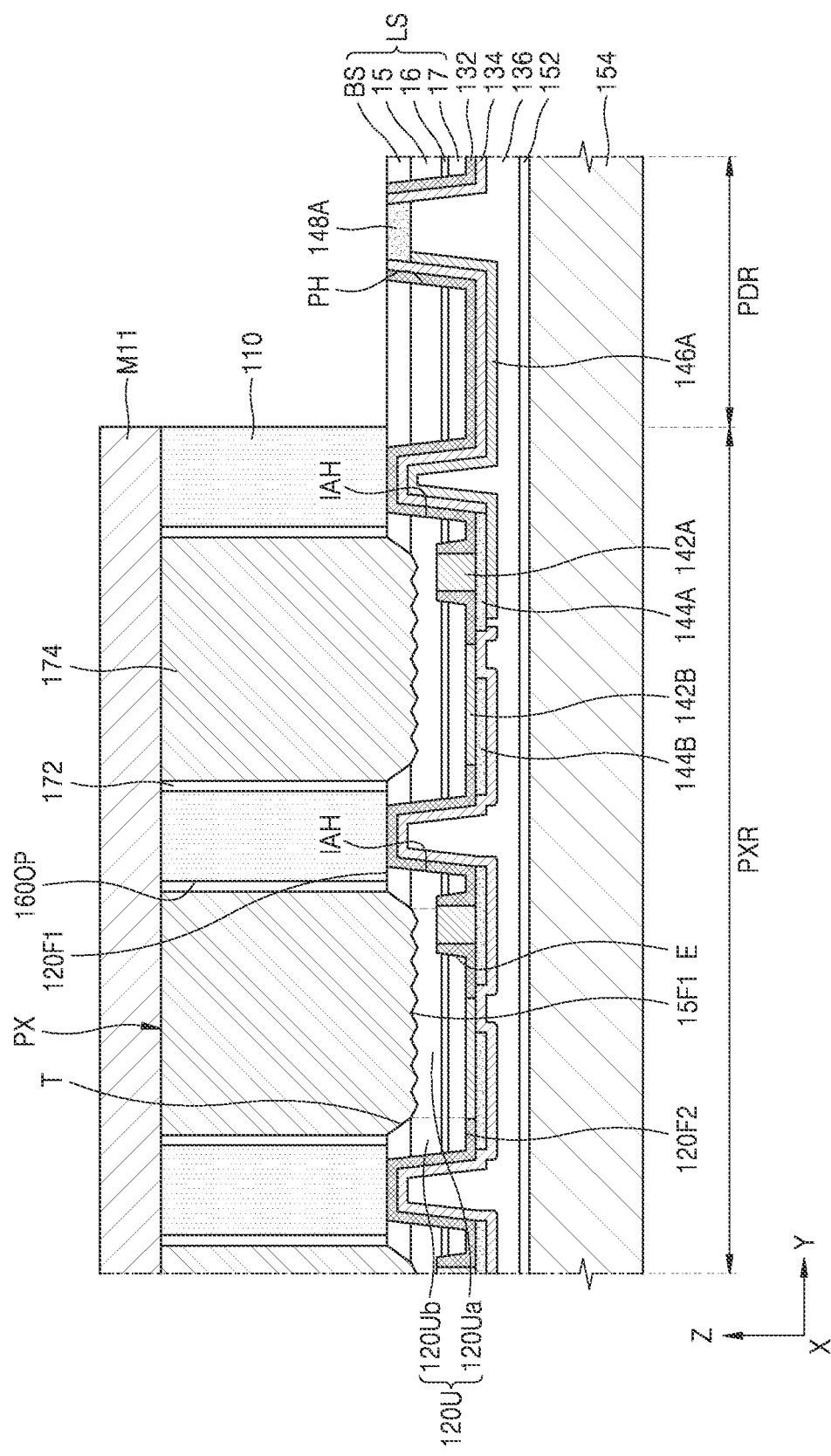

SEMICONDUCTOR LIGHT-EMITTING DEVICE INCLUDING BUFFER STRUCTURE

CROSS-REFERENCE TO RELATED APPLICATION

This application claims priority from Korean Patent Application No. 10-2020-0062653, filed on May 25, 2020, in the Korean Intellectual Property Office, the disclosure of which is incorporated by reference herein in its entirety.

BACKGROUND

1. Field

The present disclosure relates to a semiconductor light-emitting device and, more particularly, to a semiconductor light-emitting device including a buffer structure.

2. Description of Related Art

In a semiconductor light-emitting device, when a nitride-based semiconductor layer for a light-emitting device is formed, there may be differences in lattice constant and coefficient of thermal expansion (CTE) between a substrate and the nitride-based semiconductor layer. Thus, the performance of the semiconductor light-emitting device may be degraded due to an increase in the dislocation density of the nitride-based semiconductor layer, and the nitride-based semiconductor layer may crack due to tensile stress.

SUMMARY

It is an aspect to provide a semiconductor light-emitting device including a buffer structure, which may improve the performance of a light-emitting device and reduce the occurrence of cracks.

According to an aspect of one or more embodiments, there is provided a semiconductor light-emitting device comprising a buffer structure; a first-type semiconductor layer on the buffer structure; an active layer on the first-type semiconductor layer; and a second-type semiconductor layer on the active layer, wherein the buffer structure comprises a nucleation layer, a first dislocation-removing structure on the nucleation layer, and a buffer layer on the first dislocation-removing structure, the first dislocation-removing structure comprises a first material layer on the nucleation layer and a second material layer on the first material layer, the second material layer having a lattice constant different from a lattice constant of the first material layer, a roughness of a surface of the first material layer in contact with the second material layer is higher than a roughness of a surface of the nucleation layer in contact with the first material layer and higher than a roughness of a surface of the second material layer in contact with the buffer layer, and a lattice constant of the buffer layer is between the lattice constant of the second material layer and a lattice constant of the first-type semiconductor layer.

According to another aspect of one or more embodiments, there is provided a semiconductor light-emitting device comprising a partition wall structure having an opening; and a light-emitting structure comprising a buffer structure, a first-type semiconductor layer, an active layer, and a second-type semiconductor layer, which are stacked on the partition wall structure, wherein the light-emitting structure further comprises a trench, which passes through the buffer structure and overlaps the opening of the partition wall structure.

According to another aspect of one or more embodiments, there is provided a semiconductor light-emitting device comprising a plurality of light-emitting structures, each of the plurality of light-emitting structures comprising a buffer structure, a first-type semiconductor layer, an active layer, and a second-type semiconductor layer; a filling insulating layer filling spaces between the plurality of light-emitting structures; and a partition wall structure on the filling insulating layer, the partition wall structure comprising a plurality of openings exposing a central portion of each of the plurality of light-emitting structures while covering a peripheral portion of each of the plurality of light-emitting structures.

BRIEF DESCRIPTION OF THE DRAWINGS

Various embodiments will be more clearly understood from the following detailed description taken in conjunction with the accompanying drawings in which:

FIGS. 9A to 9M are cross-sectional views illustrating a method of manufacturing a semiconductor light-emitting device according to an embodiment;

DETAILED DESCRIPTION

Figure 1:
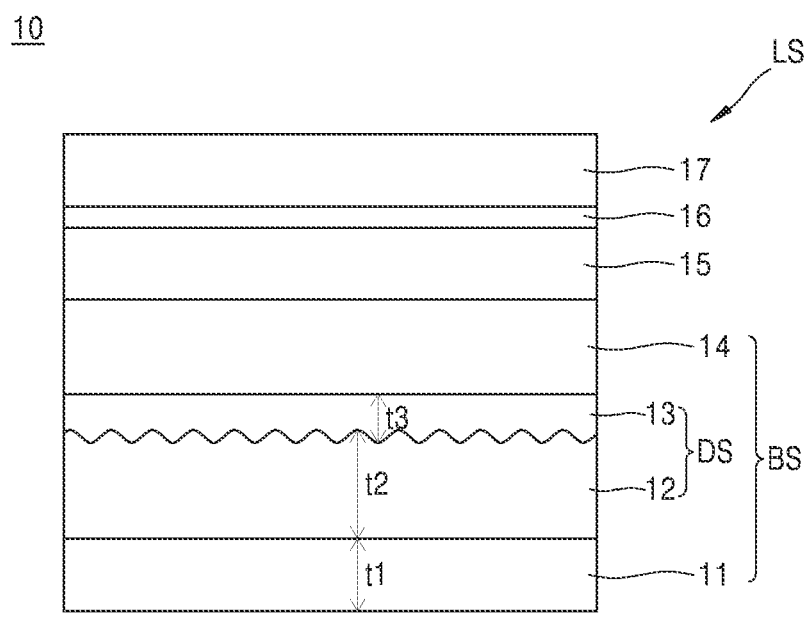
FIG. 1 is a cross-sectional view of a semiconductor light-emitting device according to an embodiment.

FIG. 1 is a cross-sectional view of a semiconductor light-emitting device 10 according to an embodiment.

Referring to FIG. 1, the semiconductor light-emitting device 10 may include a light-emitting stack LS. The light-emitting stack LS may include a buffer structure BS, a first-type semiconductor layer 15 positioned on the buffer structure BS, an active layer 16 positioned on the first-type semiconductor layer 15, and a second-type semiconductor layer 17 positioned on the active layer 16.

The buffer structure BS may include a nucleation layer 11, a dislocation-removing structure DS positioned on the nucleation layer 11, and a buffer layer 14 positioned on the dislocation-removing structure DS.

The nucleation layer 11 may be a layer for forming nuclei for crystal growth. The nucleation layer 11 may prevent a melt-back phenomenon from occurring where gallium (Ga) included in another layer (e.g., a first material layer 12 or the buffer layer 14) of the buffer structure BS contacts and reacts with silicon (Si) included in a substrate for growing the buffer structure BS. Also, the nucleation layer 11 may assist the wetting of the dislocation-removing structure DS. In some embodiments, the nucleation layer 11 may include aluminum nitride (AlN).

The dislocation-removing structure DS may include the first material layer 12 positioned on the nucleation layer 11 and a second material layer 13 positioned on the first material layer 12. The first material layer 12 may include $B_xAl_yIn_zGa_{1-x-y-z}N$ (where $0 \leq x \leq 1$, $0 < y < 1$, $0 \leq z < 1$, and $0 \leq x+y+z < 1$). In some embodiments, a composition ratio of the first material layer 12 may be substantially constant from a bottom surface of the first material layer 12 to a top surface thereof. That is, although the composition ratio of the first material layer 12 is intended to be constant from the bottom surface of the first material layer 12 to the top surface thereof, changes in the composition due to constraints of an actual process may be allowed. In some embodiments, an aluminum (Al) content of the first material layer 12 may be in a range of about 20 atomic percent (at %) to about 75 at %, for example, about 25 atomic percent (at %) to about 75 at %.

The second material layer 13 may have a different lattice constant from the first material layer 12. In some embodiments, the second material layer 13 may include the same material as the nucleation layer 11. For example, the second material layer 13 may include aluminum nitride (AlN). At an interface between the first and second material layers 12 and 13 (i.e., a top surface of the first material layer 12), a dislocation may be bent or a dislocation half-loop may be formed due to a difference in lattice constant between the first and second material layers 12 and 13 to reduce the dislocation.

Furthermore, a roughness of the top surface of the first material layer 12 may be higher than a roughness of a top surface of the nucleation layer 11 and a roughness of a top surface of the second material layer 13. The top surface of the first material layer 12 may have a roughness of about 10 nm to about 500 nm. Each of the top surface of the nucleation layer 11 and the top surface of the second material layer 13 may have a roughness of about 0 nm to about 10 nm. That is, the top surface of the nucleation layer 11 may be substantially coplanar with the top surface of the second material layer 13. A relatively high roughness of an interface between the first material layer 12 and the second material layer 13 (i.e., the top surface of the first material layer 12) may bend a dislocation and reduce a dislocation density.

In some cases, the lattice constant of the second material layer 13 may be lower than the lattice constant of the first material layer 12. Accordingly, the second material layer 13 may cause tensile stress and result in the occurrence of cracks. Thus, in some embodiments, the second material layer 13 may be formed to a thickness t3, which is less than a thickness t1 of the nucleation layer 11, and thus, tensile stress may be reduced to prevent cracks from occurring. As used herein, a thickness of a layer may be defined as a maximum thickness of the layer.

The buffer layer 14 may reduce differences in lattice constant and coefficient of thermal expansion (CTE) between a layer (e.g., the first-type semiconductor layer 15) formed on the buffer structure BS and the second material layer 13. For example, a lattice constant of the buffer layer 14 may be between a lattice constant of the first-type semiconductor layer 15 and a lattice constant of the second material layer 13. In addition, a CTE of the buffer layer 14 may be between a CTE of the first-type semiconductor layer 15 and a CTE of the second material layer 13. In some embodiments, the buffer layer 14 may include the same material as the first material layer 12. In some embodiments, the buffer layer 14 may include $B_xAl_yIn_zGa_{1-x-y-z}N$ (where $0 \leq x < 1$, $0 < y < 1$, $0 \leq z < 1$, and $0 \leq x+y+z < 1$).

In some embodiments, at least one of the nucleation layer 11, the first material layer 12, the second material layer 13, and the buffer layer 14 may be doped with silicon (Si). The silicon doping process may reduce tensile stress or cause compressive stress to prevent cracks from occurring. For example, a silicon dopant concentration may be about 0 $cm^{-3}$ to about $10^{19}$ $cm^{-3}$.

The first-type semiconductor layer 15 may include a nitride-based semiconductor doped with n-type impurities, and the second-type semiconductor layer 17 may include a nitride-based semiconductor doped with p-type impurities. In other embodiments, the first-type semiconductor layer 15 and the second-type semiconductor layer 17 may respectively include a nitride-based semiconductor doped with p-type impurities and a nitride-based semiconductor doped with n-type impurities, respectively. The n-type impurities may include, for example, silicon (Si), germanium (Ge), selenium (Se), tellurium (Te), or a combination thereof. The p-type impurities may include, for example, magnesium (Mg), zinc (Zn), beryllium (Be), cadmium (Cd), barium (Ba), calcium (Ca), or a combination thereof. The nitride-based semiconductor may include $Al_xIn_yGa_{1-x-y}N$ (where $0 \leq x \leq 1$, $0 \leq y \leq 1$, and $0 \leq x+y \leq 1$). For example, the first-type semiconductor layer 15 may include n-type-doped GaN, and the second-type semiconductor layer 17 may include p-type-doped GaN. Although each of the first-type semiconductor layer 15 and the second-type semiconductor layer 17 is illustrated as a single layer, in some embodiments, each of the first-type semiconductor layer 15 and the second-type semiconductor layer 17 may have a multilayered structure.

The active layer 16 may emit light by recombination of electrons and holes. In some embodiments, the active layer 16 may be a layer including a single material, such as InGaN. In other embodiments, the active layer 16 may have a single quantum well (SQW) structure or a multiple quantum well (MQW) structure in which quantum barrier layers and quantum well layers are alternately stacked. For example, the active layer 16 may have a quantum well structure including a combination of GaN/InGaN, a combination of AlGaN/InGaN, or a combination of InAlGaN/InGaN.

The light-emitting stack LS may be formed by, for example, sequentially forming the nucleation layer 11, the first material layer 12, the second material layer 13, the buffer layer 14, the first-type semiconductor layer 15, the active layer 16, and the second-type semiconductor layer 17 on a substrate (not shown). The nucleation layer 11, the first material layer 12, the second material layer 13, the buffer layer 14, the first-type semiconductor layer 15, the active layer 16, and the second-type semiconductor layer 17 may be formed using, for example, a metal-organic chemical vapor deposition (MOCVD) process, a molecular beam epitaxy (MBE) process, or a hydride vapor phase epitaxy (HVPE) process.

Figure 5:
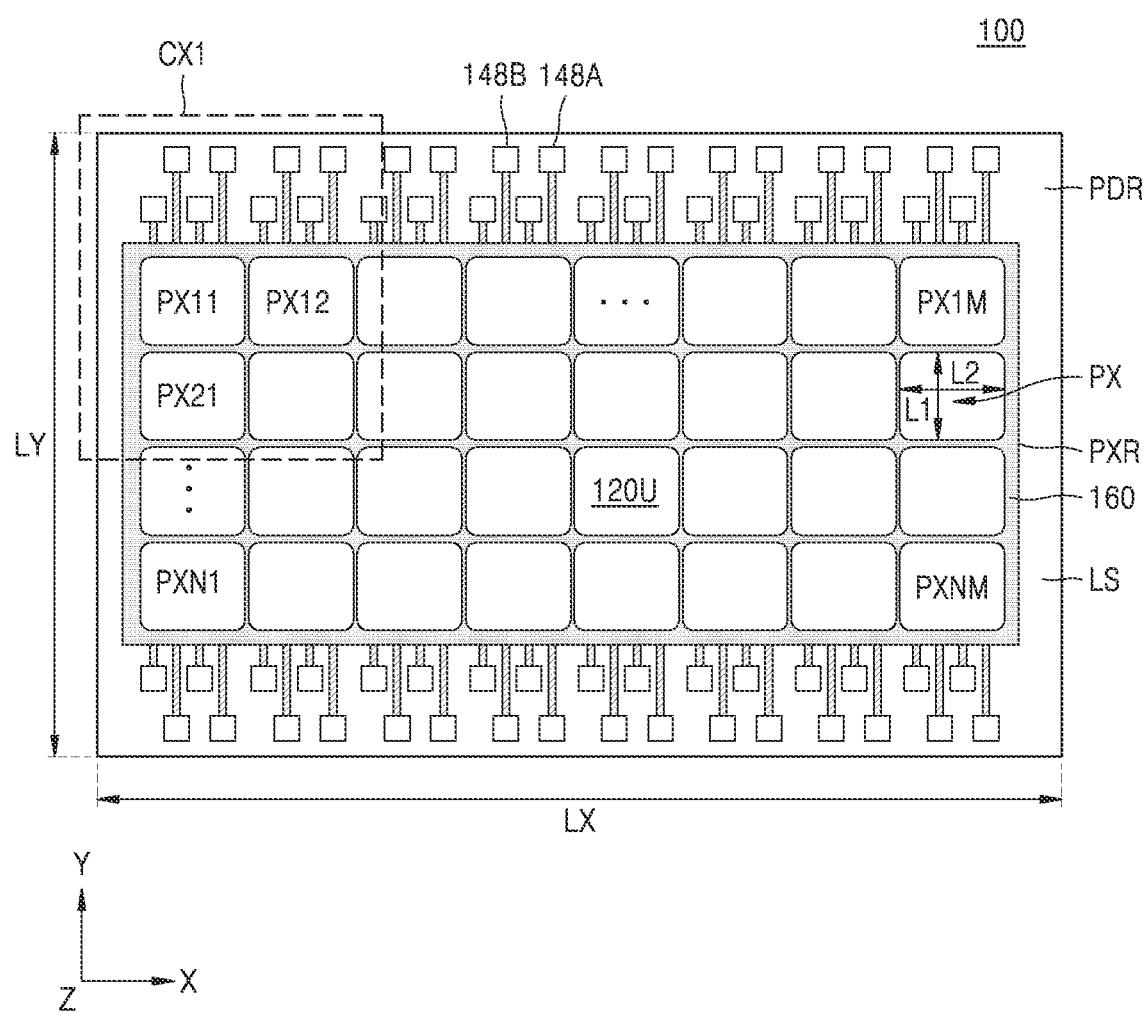
FIG. 5 is a plan view of a semiconductor light-emitting device according to an embodiment.
Figure 6:
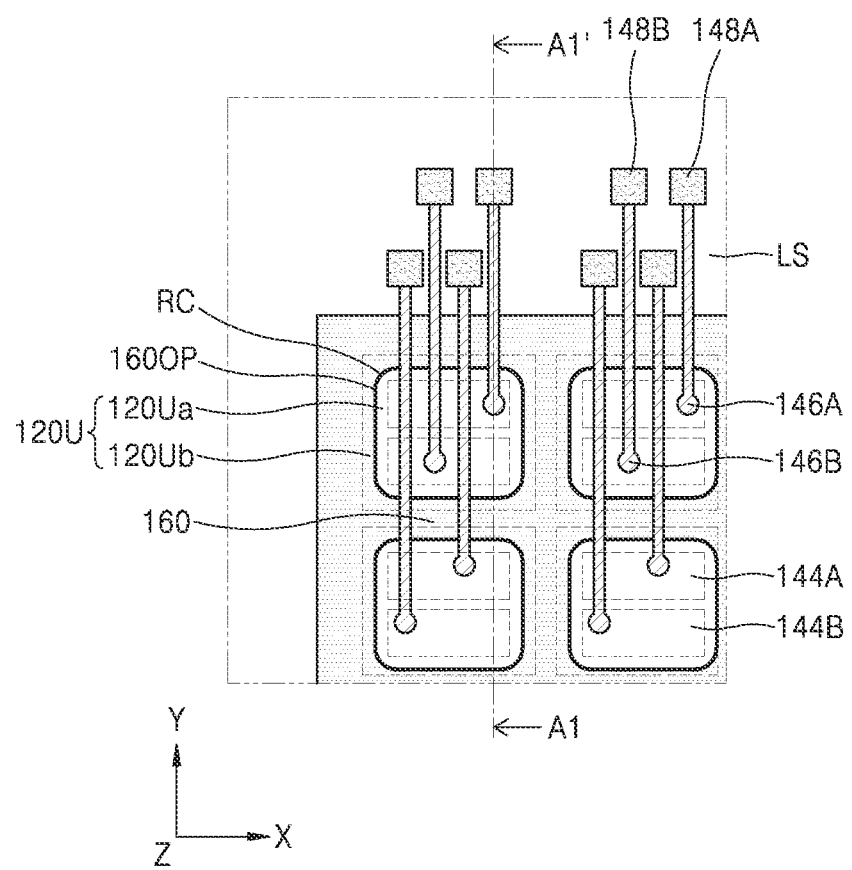
FIG. 6 is an enlarged view of region CX1 of FIG. 5.
Figure 7:
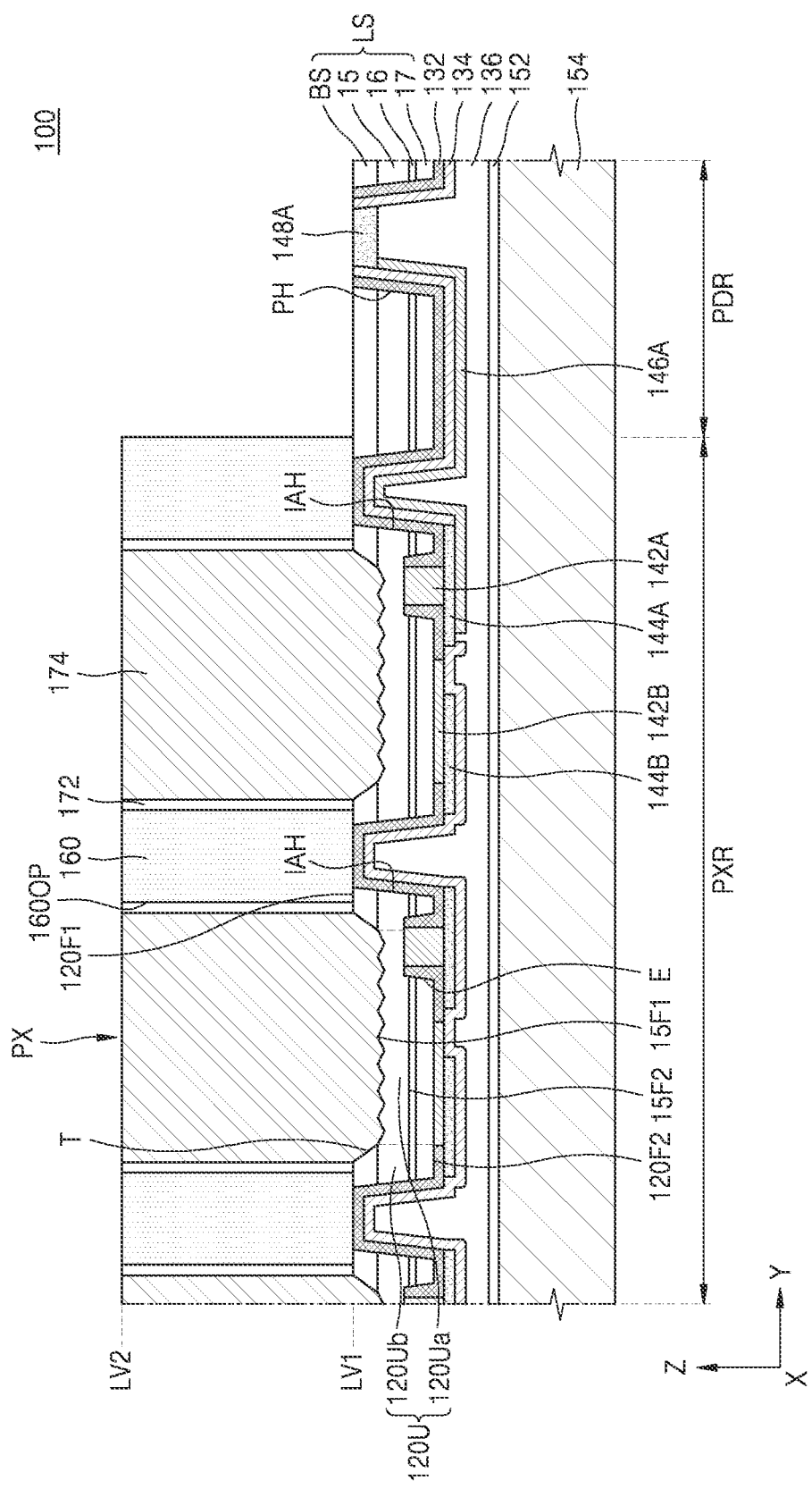
FIG. 7 is a cross-sectional view taken along line A1-A1' of FIG. 5.

In some embodiments, the substrate may be removed after the light-emitting stack LS is formed. In other embodiments, the substrate may not be removed but included in a final semiconductor light-emitting device 10. In still other embodiments, as shown in FIGS. 5 to 7, a portion of a substrate may be removed and only the remaining portion the substrate may be left as a partition wall structure 160 in a semiconductor light-emitting device 100.

In some embodiments, before the nucleation layer 11 is formed on the substrate, an oxide film (e.g., $SiO_2$) on the substrate may be removed using, for example, a high-temperature treatment process. Subsequently, an Al pre-flow process may be performed at a low temperature to prevent Si melt-back of the substrate from occurring due to Ga and prevent Si—N bonds from occurring. Thereafter, the nucleation layer 11 may be formed on the substrate.

The first material layer 12 may be formed to have a rough top surface. In some embodiments, process conditions under which the first material layer 12 is formed to have a rough top surface may be used. For example, the first material layer 12 may be formed at a temperature of about 1100° C. or lower. In other embodiments, the first material layer 12 having a planar top surface may be formed and then surface-treated or etched, thereby forming the first material layer 12 having a rough top surface. In spite of the rough top surface of the first material layer 12, process conditions under which the second material layer 13 is formed to have a planar top surface may be used. For example, the second material layer 13 may be formed at a temperature of about 1100° C. or higher.

After the buffer layer 14 is formed, the first-type semiconductor layer 15 may be initially formed at a relatively low temperature of about 900° C. to about 1100° C. so that a roughness of a top surface of the buffer layer 14 may be prevented from deteriorating the crystallinity of the first-type semiconductor layer 15. The first-type semiconductor layer 15 may be subsequently formed at a relatively high temperature of about 1100° C. or higher.

Figure 2A:
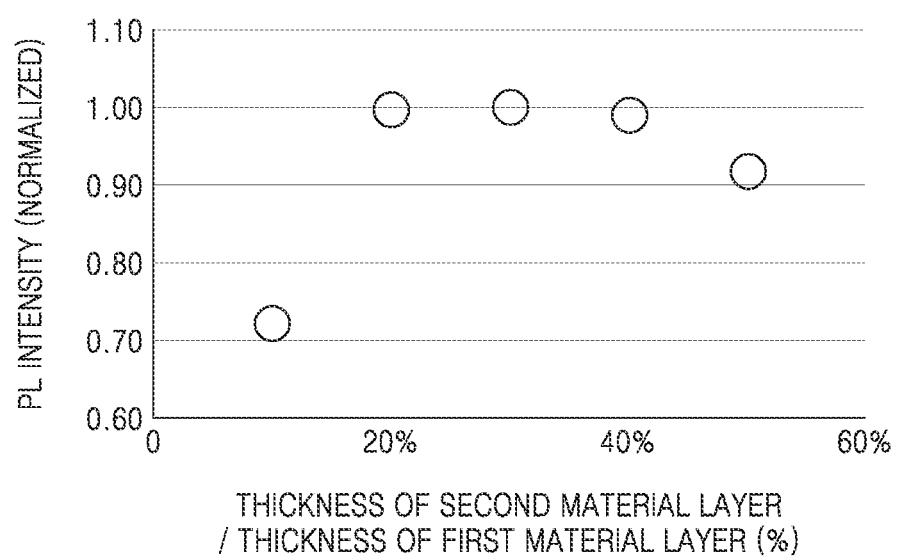
FIG. 2A shows experimental data about normalized photoluminescence (PL) intensity with respect to a ratio of a thickness of a second material layer to a thickness of a first material layer.
Figure 2B:
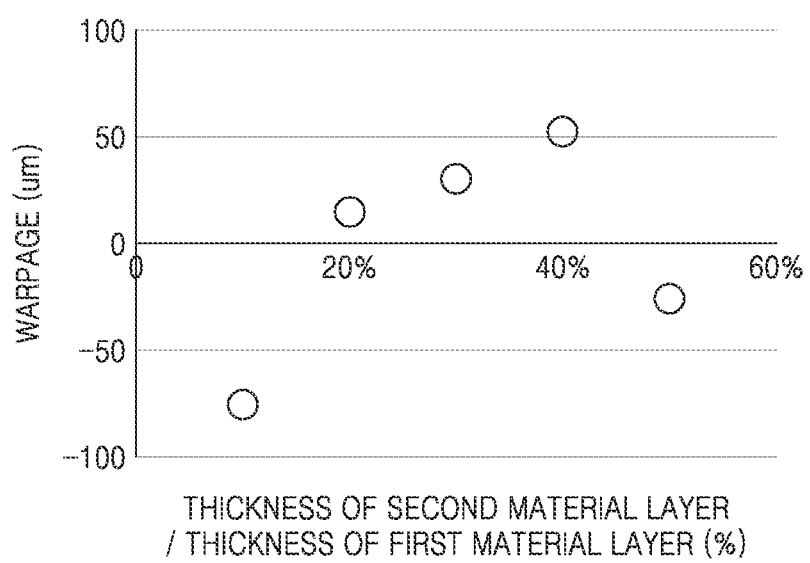
FIG. 2B shows experimental data about warpage of a light-emitting stack formed on a silicon (Si) substrate with respect to a ratio of a thickness of a second material layer to a thickness of a first material layer.

FIG. 2A shows experimental data about normalized photoluminescence (PL) intensity with respect to a ratio of a thickness of a second material layer to a thickness of a first material layer; FIG. 2B shows experimental data about warpage of a light-emitting stack formed on a silicon (Si) substrate with respect to a ratio of a thickness of a second material layer to a thickness of a first material layer;

Referring to FIGS. 1, 2A, and 2B, when the thickness t3 of the second material layer 13 is about 10% or less or about 50% or more of a thickness t2 of the first material layer 12 (i.e., the ratio of the thicknesses is less than about 10% or more than about 50%), it is observed that the luminous efficiency of the semiconductor light-emitting device 10 is rapidly reduced. In this case, a rapid increase in tensile stress may result in the rapid reduction in the luminous efficiency of the semiconductor light-emitting device 10. The tensile stress may cause the occurrence of cracks.

In addition, when the thickness t3 of the second material layer 13 is about 10% or less or about 50% or more of the thickness t2 of the first material layer 12 (i.e., the ratio of the thicknesses is less than about 10% or more than about 50%), it is observed that a direction of the warpage of the light-emitting stack LS formed on a silicon substrate changed. Positive (+) warpage may indicate that compressive stress is generated in the light-emitting stack LS, and negative (−) warpage may indicate that tensile stress is generated in the light-emitting stack LS. When the thickness t3 of the second material layer 13 is about 10% or less or about 50% or more of the thickness t2 of the first material layer 12, it may be seen from the direction of warpage that tensile stress is generated in the light-emitting stack LS. The tensile stress may cause the occurrence of cracks.

Therefore, to increase luminous efficiency, reduce tensile stress, and prevent cracks from occurring, the first and second material layers 12 and 13 may be formed such that the thickness t3 of the second material layer 13 is in a range of about 10% to about 50% (e.g., about 15% to about 45%) of the thickness t2 of the first material layer 12.

Figure 3:
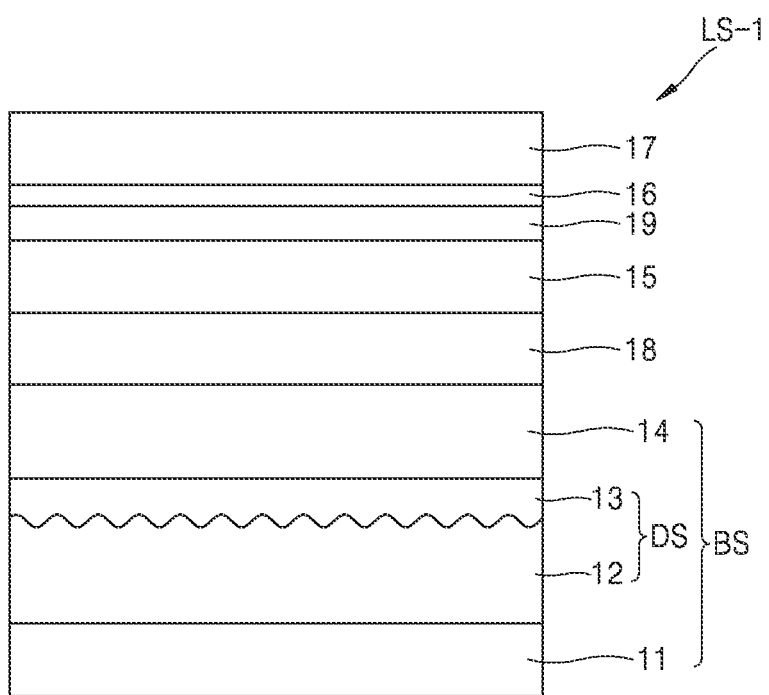
FIG. 3 a cross-sectional view of a semiconductor light-emitting device according to an embodiment.

FIG. 3 a cross-sectional view of a semiconductor light-emitting device 10-1 according to an embodiment.

Referring to FIG. 3, the semiconductor light-emitting device 10-1 may include a light-emitting stack LS-1. In some embodiments, the light-emitting stack LS-1 may further include an undoped semiconductor layer 18 between a buffer layer 14 and a first-type semiconductor layer 15. The undoped semiconductor layer 18 may increase the crystallinity of the first-type semiconductor layer 15. The undoped semiconductor layer 18 may include a nitride-based semiconductor, for example, $Al_xIn_yGa_{1-x-y}N$ (where $0 \le x \le 1$, $0 \le y \le 1$, and $0 \le x+y \le 1$).

In some embodiments, the light-emitting stack LS-1 may further include a superlattice structure 19. The superlattice structure 19 may have a structure in which a plurality of layers having different bandgap energies are alternately stacked. Each of the layers included in the superlattice structure 19 may include $Al_xIn_yGa_{1-x-y}N$ (where $0 \le x \le 1$, $0 \le y \le 1$, and $0 \le x+y \le 1$). For example, the superlattice structure 19 may include a combination of GaN/InGaN, a combination of AlGaN/GaN, or a combination of AlGaN/GaN/InGaN. In some embodiments, the superlattice structure 19 may be between the first-type semiconductor layer 15 and an active layer 16. In other embodiments, the superlattice structure 19 may be between a buffer structure BS and the first-type semiconductor layer 15. The superlattice structure 19 may adjust stress and reduce crystal defects. Also, the superlattice structure 19 may facilitate the diffusion of current by increasing a carrier mobility. The remaining elements of the semiconductor light-emitting device 10-1 are similar to the semiconductor light-emitting device 10 described with respect to FIG. 1 and thus repeated description thereof is omitted for conciseness.

Figure 4:
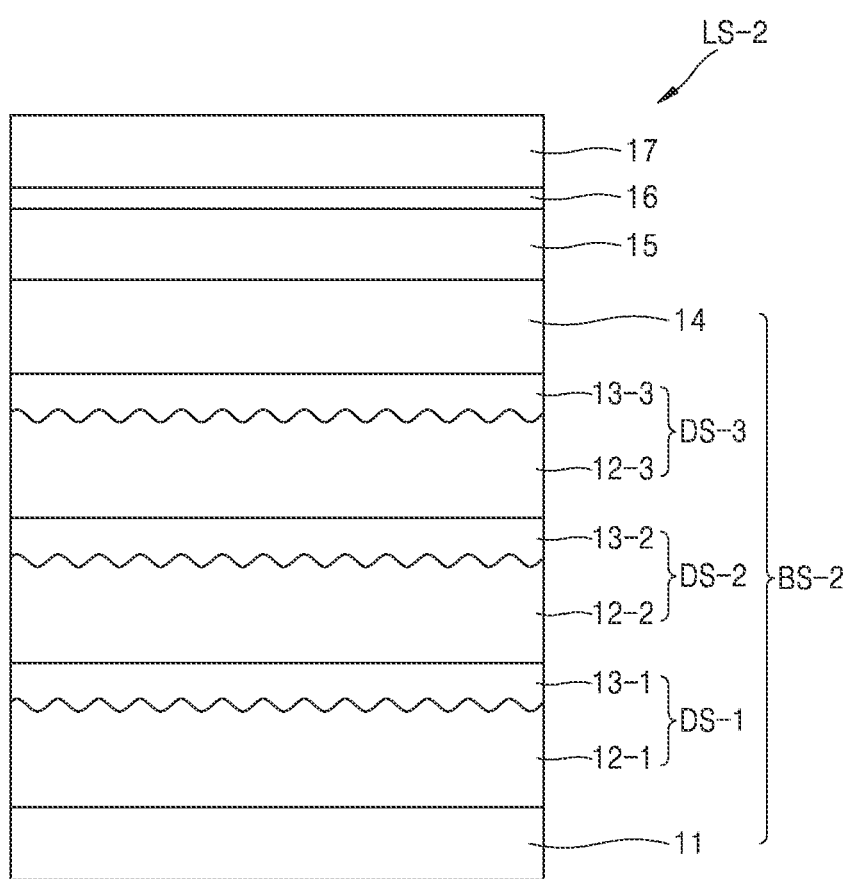
FIG. 4 is a cross-sectional view of a semiconductor light-emitting device according to an embodiment.

FIG. 4 is a cross-sectional view of a semiconductor light-emitting device 10-2 according to an embodiment.

Referring to FIG. 4, the semiconductor light-emitting device 10-2 may include a light-emitting stack LS-2. The light-emitting stack LS-2 may include a buffer structure BS-2. The buffer structure BS-2 may include a nucleation layer 11, a plurality of dislocation-removing structures (e.g., first to third dislocation-removing structures DS-1, DS-2, and DS-3), and a buffer layer 14, which are vertically stacked. Although FIG. 4 illustrates a case in which the buffer structure BS-2 includes three dislocation-removing structures (e.g., DS-1, DS-2, and DS-3), in other embodiments the number of dislocation-removing structures included in the buffer structure BS-2 may be greater or less than 3. The first to third dislocation-removing structures DS-1, DS-2, and DS-3 may improve the capability of the buffer structure BS-2 to reduce a dislocation density.

The first dislocation structure DS-1 may include a first material layer 12-1 positioned on the nucleation layer 11 and a second material layer 13-1 positioned on the first material layer 12-1. The second dislocation structure DS-2 may include a third material layer 12-2 positioned on the second material layer 13-1 and a fourth material layer 13-2 positioned on the third material layer 12-2. The third dislocation structure DS-3 may include a fifth material layer 12-3 positioned on the fourth material layer 13-2 and a sixth material layer 13-3 positioned on the fifth material layer 12-3. The second material layer 13-1, the fourth material layer 13-2, and the sixth material layer 13-3 may respectively have lattice constants different from lattice constants of the first material layer 12-1, the third material layer 12-2, and the fifth material layer 12-3.

In some embodiments, the first material layer 12-1, the third material layer 12-2, and the fifth material layer 12-3 may include the same material. For example, the first material layer 12-1, the third material layer 12-2, and the fifth material layer 12-3 may include $B_xAl_yIn_zGa_{1-x-y-z}N$ (where 0≤x<0, 0<y<1, 0≤z<1, and 0≤x+y+z<1). In some embodiments, the second material layer 13-1, the fourth material layer 13-2, and the sixth material layer 13-3 may include the same material. For example, the second material layer 13-1, the fourth material layer 13-2, and the sixth material layer 13-3 may include AlN.

A roughness of a top surface of the first material layer 12-1 may be higher than a roughness of a top surface of the nucleation layer 11 and a roughness of a top surface of the second material layer 13-1. A roughness of a top surface of the third material layer 12-2 may be higher than the roughness of the top surface of the second material layer 13-1 and a roughness of a top surface of a fourth material layer 13-2. A roughness of a top surface of the fifth material layer 12-3 may be higher than the roughness of the top surface of the fourth material layer 13-2 and a roughness of a top surface of the sixth material layer 13-3. The top surface of each of the first material layer 12-1, the third material layer 12-2, and the fifth material layer 12-3 may have a roughness of about 10 nm to about 500 nm. The top surface of each of the nucleation layer 11, the second material layer 13-1, the fourth material layer 13-2, and the sixth material layer 13-3 may have a roughness of about 0 nm to about 10 nm. That is, the top surfaces of the nucleation layer 11, the second material layer 13-1, the fourth material layer 13-2, and the sixth material layer 13-3 may be substantially planar. In some embodiments, the roughness of the top surface of the third material layer 12-2 may be lower than the roughness of the top surface of the first material layer 12-1, and the roughness of the top surface of the fifth material layer 12-3 may be lower than the roughness of the top surface of the third material layer 12-2. By reducing an interface roughness in a direction toward the first-type semiconductor layer 15, the interface roughness may be prevented from deteriorating the crystallinity of each of the first-type semiconductor layer 15, the active layer 16, and the second-type semiconductor layer 17.

Each of an interface between the first material layer 12-1 and the second material layer 13-1, an interface between the third material layer 12-2 and the fourth material layer 13-2, and an interface between the fifth material layer 12-3 and the sixth material layer 13-3, which has a difference in lattice constant and is relatively rough, may reduce a dislocation density. Accordingly, a dislocation density of the fourth material layer 13-2 may be lower than a dislocation density of the second material layer 13-1, and a dislocation density of the sixth material layer 13-3 may be lower than the dislocation density of the fourth material layer 13-2.

A lattice constant of the buffer layer 14 may be between a lattice constant of the sixth material layer 13-3 and a lattice constant of the first-type semiconductor layer 15.

FIG. 5 is a plan view of a semiconductor light-emitting device 100 according to an embodiment. FIG. 6 is an enlarged view of region CX1 of FIG. 5. FIG. 7 is a cross-sectional view taken along line A1-A1' of FIG. 6. Some components of the semiconductor light-emitting device 100 are omitted in FIGS. 5 and 6 for brevity.

Referring to FIGS. 5 to 7, the semiconductor light-emitting device 100 may include a pixel region PXR and a pad region PDR surrounding the pixel region PXR. In the pixel region PXR, M pixels PX (e.g., PX11, PX12, . . . , and PX1M) may be arranged in an X-axis direction, and N pixels PX (e.g., PX11, PX21, . . . , and PXN1) may be arranged in a Y-axis direction. Although FIG. 5 illustrates a total of 32 pixels PX arranged as an array in which 8 pixels are arranged in the X-axis direction and 4 pixels are arranged in the Y-axis direction, in various embodiments the number of pixels PX arranged in the X-axis direction, the number of pixels PX arranged in the Y-axis direction, and the total number of pixels PX may be changed. Although FIG. 5 illustrates a case in which the respective pixels PX have the same size, in some embodiments, all the pixels may not have the same size. For example, a Y-directional length L2 of some pixels PX may be greater than an X-directional length L1 thereof, and an X-directional length L1 of the remaining pixels PX may be equal to a Y-directional length L2 thereof. For example, a ratio of the X-directional length L1 of some pixels PX to the Y-directional length L2 thereof may be in a range of about 1.5:1 to about 4.5:1.

As shown in FIG. 5, the semiconductor light-emitting device 100 may substantially have a rectangular shape in a view from above. A length of a first side of the rectangular shape (i.e., an X-directional length LX of the semiconductor light-emitting device 100) may be greater than a length of a second side of the rectangular shape (i.e., a Y-directional length LY of the semiconductor light-emitting device 100). According to example embodiments, the X-directional length LX of the semiconductor light-emitting device 100 may be greater than or equal to about 1.1 times the Y-directional length LY thereof. According to example embodiments, the X-directional length LX of the semiconductor light-emitting device 100 may be less than or equal to about 100 times the Y-directional length LY thereof. According to example embodiments, a thickness (i.e., a Z-directional length) of the semiconductor light-emitting device 100 may be several tens of μm to several hundreds of μm. According to example embodiments, the thickness of the semiconductor light-emitting device 100 may be less than or equal to about 1/10 the X-directional length LX of the semiconductor light-emitting device 100. Because the semiconductor light-emitting device 100 has the above-described dimensions, which are optimized for resistance to physical stress, the warpage of the semiconductor light-emitting device 100 may be minimized.

A plurality of light-emitting structures 120U may be respectively in a plurality of pixels PX to form an array of light-emitting structures 120U (see FIG. 6). The partition wall structure 160 may be between the light-emitting structures 120U and surround each of the light-emitting structures 120U. In the pad region PDR, the light-emitting stack LS may surround a plurality of light-emitting structures 120U.

The plurality of light-emitting structures 120U may be isolated from each other by an isolation opening IAH (See FIG. 7). In an example process, the isolation opening IAH may be formed by removing a portion of the light-emitting stack LS, and thus, the plurality of light-emitting structures 120U may be obtained from the light-emitting stack LS in the pixel region PXR. Also, a portion of the light-emitting stack LS may remain in the pad region PDR and surround the pixel region PXR in a view from above. The light-emitting stack LS may be one of the light-emitting stacks LS, LS-1, and LS-2 described with reference to FIGS. 1, 3, and 4, respectively. As shown in FIG. 7, for example, the light-emitting stack LS may include a buffer structure BS, a first-type semiconductor layer 15, an active layer 16 and a second-type semiconductor layer 17. In FIG. 7, a top surface of the buffer structure BS of the light-emitting structure 120U may be defined as a first surface 120F1 of the light-emitting structure 120U, and a bottom surface of the second-type semiconductor layer 17 of the light-emitting structure 120U may be defined as a second surface 120F2 of the light-emitting structure 120U.

A first electrode 142A, a second electrode 142B, a first insulating layer 132, a first connection electrode 144A, and a second connection electrode 144B may be further positioned on the light-emitting structure 120U. The first electrode 142A may be inside an electrode opening E, which passes through the active layer 16 and the second-type semiconductor layer 17, and is in contact with the first-type semiconductor layer 15. The second electrode 142B may be on the bottom surface of the second-type semiconductor layer 17 (i.e., the second surface 120F2 of the light-emitting structure 120U). The first electrode 142A and the second electrode 142B may include a material having a high reflectivity. For example, the first electrode 142A and the second electrode 142B may include silver (Ag), aluminum (Al), nickel (Ni), chromium (Cr), copper (Cu), gold (Au), titanium (Ti), platinum (Pt), palladium (Pd), tin (Sn), tungsten (W), rhodium (Rh), iridium (Ir), ruthenium (Ru), magnesium (Mg), zinc (Zn), or a combination thereof.

The first insulating layer 132 may cover an inner wall of the electrode opening E and electrically insulate the first electrode 142A from the active layer 16 and the second-type semiconductor layer 17. In addition, the first insulating layer 132 may be further between the first electrode 142A and the second electrode 142B on the bottom surface of the second-type semiconductor layer 17 (i.e., the second surface 120F2 of the light-emitting structure 120U) and electrically insulate the first electrode 142A from the second electrode 142B. In some embodiments, the first insulating layer 132 may further extend on a side surface of the light-emitting structure 120U and a bottom surface of the partition wall structure 160. In some embodiments, a top surface of the first insulating layer 132 may be at the same vertical level LV1 as the first surface 120F1 of the light-emitting structure 120U. The first insulating layer 132 may include an insulating material including silicon oxide, silicon nitride, or a combination thereof.

The first connection electrode 144A may be on the first electrode 142A and the first insulating layer 132, and the second connection electrode 144B may be on the second electrode 142B and the first insulating layer 132. The first connection electrode 144A and the second connection electrode 144B may include Ag, Al, Ni, Cr, Cu, Au, Ti, Pt, Pd, Sn, W, Rh, Ir, Ru, Mg, Zn, or a combination thereof.

A second insulating layer 134 may be on the first insulating layer 132. Also, the second insulating layer 134 may conformally cover the first connection electrode 144A and the second connection electrode 144B. The second insulating layer 134 may include silicon oxide, silicon nitride, or a combination thereof.

A pad opening PH passing through the light-emitting stack LS may be in the pad region PDR. A first pad 148A and a second pad 148B may be inside the pad opening PH. In some embodiments, a top surface of the first pad 148A and a top surface of the second pad 148B may be coplanar with the first surface 120F1 of the light-emitting structure 120U. The first pad 148A and the second pad 148B may include Ag, Al, Ni, Cr, Cu, Au, Ti, Pt, Pd, Sn, W, Rh, Ir, Ru, Mg, Zn, or a combination thereof. A connection member (e.g., a bonding wire) to be electrically connected to a semiconductor driving chip (not shown) may be on the first pad 148A and the second pad 148B. Although each of the first pad 148A and the second pad 148B is illustrated as having a regular tetragonal shape in the plan view of FIG. 6, a shape of each of the first pad 148A and the second pad 148B is not limited thereto. For example, a Y-directional length of each of the first pad 148A and the second pad 148B may be greater than an X-directional length of each of the first pad 148A and the second pad 148B. For instance, each of the first pad 148A and the second pad 148B may include a first portion to which a wire to be connected to a driving chip is adhered and a second portion, which is contacted by a probe configured to measure electrical characteristics. The first portion may have a shape different from that of the second portion. For example, a width of the first portion may be less than or equal to a width of the second portion.

A first wiring pattern 146A may connect the first connection electrode 144A to the first pad 148A. The first wiring pattern 146A may be on the second insulating layer 134 and in contact with the first connection electrode 144A. A second wiring pattern 146B may connect the second connection electrode 144B to the second pad 148B. Although not shown in FIG. 7, the second wiring pattern 146B may be on the second insulating layer 134 and in contact with the second connection electrode 144B. In some embodiments, the first connection electrode 144A and the second connection electrode 144B may be omitted, and the first wiring pattern 146A and the second wiring pattern 146B may be in direct contact with the first electrode 142A and the second electrode 142B, respectively.

In some embodiments, a third wiring pattern (not shown) may be further positioned to connect to adjacent light-emitting structures 120U. The third wiring pattern may connect the second electrode 142B (or the second connection electrode 144B) of one light-emitting structure 120U to the first electrode 142A (or the first connection electrode 144A) of an adjacent light-emitting structure 120U. Alternatively, the third wiring pattern may connect the first electrode 142A (or the first connection electrode 144A) of one light-emitting structure 120U) to the first electrode 142A (or the first connection electrode 144A) of an adjacent light-emitting structure 120U. Alternatively, the third wiring pattern may connect the second electrode 142B (or the second connection electrode 144B) of one light-emitting structure 120U to the second electrode 142B (or the second connection electrode 144B) of an adjacent light-emitting structure 120U. The third wiring pattern may be on the second insulating layer 134. In some embodiments, a third insulating layer (not shown) may be further positioned on the first wiring pattern 146A, and the third wiring pattern may be on the third insulating layer.

A filling insulating layer 136 may be on the second insulating layer 134, the first wiring pattern 146A, and the second wiring pattern 146B. The filling insulating layer 136 may have a planar bottom surface while filling the isolation opening IAH between the light-emitting structures 120U. The first insulating layer 132 and the second insulating layer 134 may be between the filling insulating layer 136 and the partition wall structure 160 and between the filling insulating layer 136 and the light-emitting structure 120U. The filling insulating layer 136 may include a silicone resin, an epoxy resin, or an acrylic resin.

A support substrate 154 may be further arranged on a bottom surface of the filling insulating layer 136. In some embodiments, by using the support substrate 154 having a high electrical resistance, electrical connection of a circuit substrate (e.g., 1400 in FIG. 11) under the support substrate 154 and the light-emitting structure 120U may be prevented. For example, the support substrate 154 may include a silicon (Si) substrate and an insulating layer formed on at least one of a top surface and a bottom surface of the silicon substrate. Alternatively or additionally, the support substrate 154 may be an undoped or lightly doped silicon substrate having a high electrical resistance. The bottom surface of the filling insulating layer 136 may be adhered to the support substrate 154 by an adhesive layer 152. The adhesive layer 152 may include, for example, an insulating material, such as silicon oxide, silicon nitride, a polymer material, or resins. In some embodiments, the adhesive layer 152 may include the same material as the filling insulating layer 136, and a boundary between the adhesive layer 152 and the filling insulating layer 136 may not be visible to the naked eye. In another embodiment, the adhesive layer 152 may include a eutectic adhesive material, such as AuSn or NiSi.

The support substrate 154 may include an insulating substrate or a conductive substrate. In example embodiments, the support substrate 154 may have an electric resistance of at least several megaohms (MΩ), for example, at least 50 MΩ. The greater the electrical resistance of the support substrate 154, the better the electrical insulating characteristics of the support substrate 154. For example, the support substrate 154 may include doped silicon, an undoped sapphire substrate, a glass substrate, a transparent conductive substrate, a silicon substrate, a silicon carbide substrate, $Al_2O_3$, tungsten (W), copper (Cu), a bismaleimide triazine (BT) resin, an epoxy resin, polyimide, a liquid crystal (LC) polymer, a copper clad laminate, or a combination thereof, but embodiments are not limited thereto.

In example embodiments, the support substrate 154 may have a thickness of at least 150 μm (e.g., about 200 μm to about 400 μm) in a vertical direction (i.e., a Z direction). When the support substrate 154 has an excessively small thickness, the emission characteristics of the semiconductor light-emitting device 100 may be adversely affected. For example, warpage of the support substrate 154 may occur. When the support substrate 154 has an excessively large thickness, components around the support substrate 154 may be deformed due to stress by the support substrate 154.

The partition wall structure 160 may be on the first surface 120F1 of each of the plurality of light-emitting structures 120U. To implement various lighting modes according to surrounding conditions in an intelligent lighting system, such as a headlamp for a vehicle, it may be advantageous to individually control the plurality of pixels PX in the semiconductor light-emitting device 100. In this case, the partition wall structure 160 may prevent light emitted from one pixel PX from being penetrated into adjacent pixels PX, and thus, the contrast characteristics of the semiconductor light-emitting device 100 may be improved.

The partition wall structure 160 may be on the filling insulating layer 136. In some embodiments, the first insulating layer 132 and/or the second insulating layer 134 may further extend between the partition wall structure 160 and the filling insulating layer 136. The partition wall structure 160 may be, for example, a silicon (Si) substrate, a silicon carbide (SiC) substrate, a sapphire substrate, or a gallium nitride (GaN) substrate. In an example process, the plurality of light-emitting structures 120U may be formed on, for example, a substrate (refer to substrate 110 in FIG. 9M) and then a plurality of openings 1600P may be formed in the substrate 110, thereby forming the partition wall structure 160. In this case, the partition wall structure 160 may be a portion of the substrate 110 for forming the light-emitting stack LS.

The partition wall structure 160 may include the plurality of openings 1600P. In some embodiments, in a view from above, each of the openings 1600P of the partition wall structure 160 may have round corners RC (see FIG. 6) to prevent cracks from occurring and propagating. In addition, each of the openings 1600P of the partition wall structure 160 may expose a central portion 120Ua of the light-emitting structure 120U corresponding thereto while covering a peripheral portion 120Ub of the light-emitting structure 120U corresponding thereto.

In some embodiments, the buffer structure BS may be included in the peripheral portion 120Ub of the light-emitting structure 120U but not included in the central portion 120Ua of the light-emitting structure 120U (see FIG. 7). That is, the light-emitting structure 120U may include a trench T, which passes through the buffer structure BS and exposes the first-type semiconductor layer 15. The trench T may overlap the opening 1600P of the partition wall structure 160. In some embodiments, to improve light extraction efficiency, a roughness of a first surface 15F1 of the first-type semiconductor layer 15 exposed by the trench T may be higher than a roughness of a second surface 15F2 of the first-type semiconductor layer 15.

In some embodiments, a reflective layer 172 may be further positioned on a side surface of the partition wall structure 160. The reflective layer 172 may reflect light emitted from the light-emitting structure 120U. The reflective layer 172 may include, for example, a metal including Ag, Al, Ni, Cr, Au, Pt, Pd, Sn, W, Rh, Ir, Ru, Mg, Zn, or a combination thereof. In other embodiments, the reflective layer 172 may include a resin (e.g., polyphthalamide (PPA)) containing a metal oxide, such as titanium oxide or aluminum oxide. In other embodiments, the reflective layer 172 may include a distributed Bragg reflector (DBR) layer. For example, the DBR layer may have a structure in which a plurality of insulating layers having different refractive indexes are repeatedly stacked several to several hundred times. Each of the insulating layers in the DBR layer may include an oxide, a nitride, or a combination thereof, for example, $SiO_2$, SiN, $SiO_xN_y$, $TiO_2$, $Si_3N_4$, $Al_2O_3$, TiN, AlN, $ZrO_2$, TiAlN, or TiSiN.

A fluorescent layer 174 may be inside the opening 1600P of the partition wall structure 160 and the trench T of the light-emitting structure 120. The partition wall structure 160 may be in contact with the reflective layer 172. In other embodiments, the reflective layer 172 may not be on the side surface of the partition wall structure 160. In this case, the side surface of the partition wall structure 160 may be in direct contact with the fluorescent layer 174. The fluorescent layer 174 may almost entirely fill the opening 1600P of the partition wall structure 160 and the trench T of the light-emitting structure 120. A top level of the fluorescent layer 174 may be equal to a top level LV2 of the partition wall structure 160. The fluorescent layer 174 may substantially have a planar top surface. The fluorescent layer 174 may be firmly fixed inside each of the openings 1600P and each of the trenches T by the partition wall structure 160.

The fluorescent layer 174 may include a material capable of converting the color of light emitted from the light-emitting structure 120U into a desired color. The fluorescent layer 174 may include a resin containing a fluorescent material dispersed therein or a film containing a fluorescent material. For example, the fluorescent layer 174 may include a fluorescent material film in which fluorescent material particles are uniformly dispersed at a certain concentration. The fluorescent material particles may be a wavelength conversion material that changes the wavelength of light emitted from the plurality of light-emitting structures 120U. The fluorescent layer 174 may include at least two kinds of fluorescent material particles having different size distributions to improve the density and color uniformity of the fluorescent material particles.

In example embodiments, the fluorescent material may have various colors and various compositions such as an oxide-based composition, a silicate-based composition, a nitride-based composition, and a fluoride-based composition. For example, $\beta$-SiAlON:Eu$^{2+}$(green), (Ca,Sr)AlSiN$_3$:Eu$^{2+}$(red), La$_3$Si$_6$N$_{11}$:Ce$^{3+}$(yellow), K$_2$SiF$_6$:Mn$_4^+$(red), SrLiAl$_3$N$_4$:Eu(red), Ln$_{4-x}$(Eu$_z$M$_{1-z}$)$_x$Si$_{12-y}$Al$_y$O$_{3+x+y}$N$_{18-x-y}$(0.5$\leq$x$\leq$3, 0<z0.3, 0<y$\leq$4(red), K$_2$TiF$_6$:Mn$_4^+$(red), NaYF$_4$:Mn$_4^+$(red), NaGdF$_4$:Mn$_4^+$(red), and the like may be used as the fluorescent material. However, the kind of the fluorescent material is not limited thereto.

In other embodiments, a wavelength conversion material, such as a quantum dot, may be further positioned on the fluorescent layer 174. The quantum dot may have a core-shell structure using a III-V or II-VI compound semiconductor. For example, the quantum dot may have a core such as CdSe and InP and a shell such as ZnS and ZnSe. In addition, the quantum dot may include a ligand for stabilizing the core and the shell.

According to various embodiments, to maximize an emission area and an area of the active layer 16, the partition wall structure 160 may be formed to overlap the peripheral portion 120Ub of the light-emitting structure 120U. Accordingly, even if the trench T exposing the first-type semiconductor layer 15 is formed, a portion of the buffer structure BS may remain under the partition wall structure 160. When the opening 1600P is formed in the partition wall structure 160 and the trench T is formed in the light-emitting structure 120U, the buffer structure BS (esp., a layer including AlN) may crack due to tensile stress and propagate into a portion of the buffer structure BS, which remains under the partition wall structure 160. The cracks may cause defects in the semiconductor light-emitting device 100. The buffer structures BS and BS-2 structurally configured as described with reference to FIGS. 1 to 4 may reduce tensile stress therein and prevent cracks from occurring, and thus, the manufacturing yield of the semiconductor light-emitting device 100 may be improved.

Figure 8A:
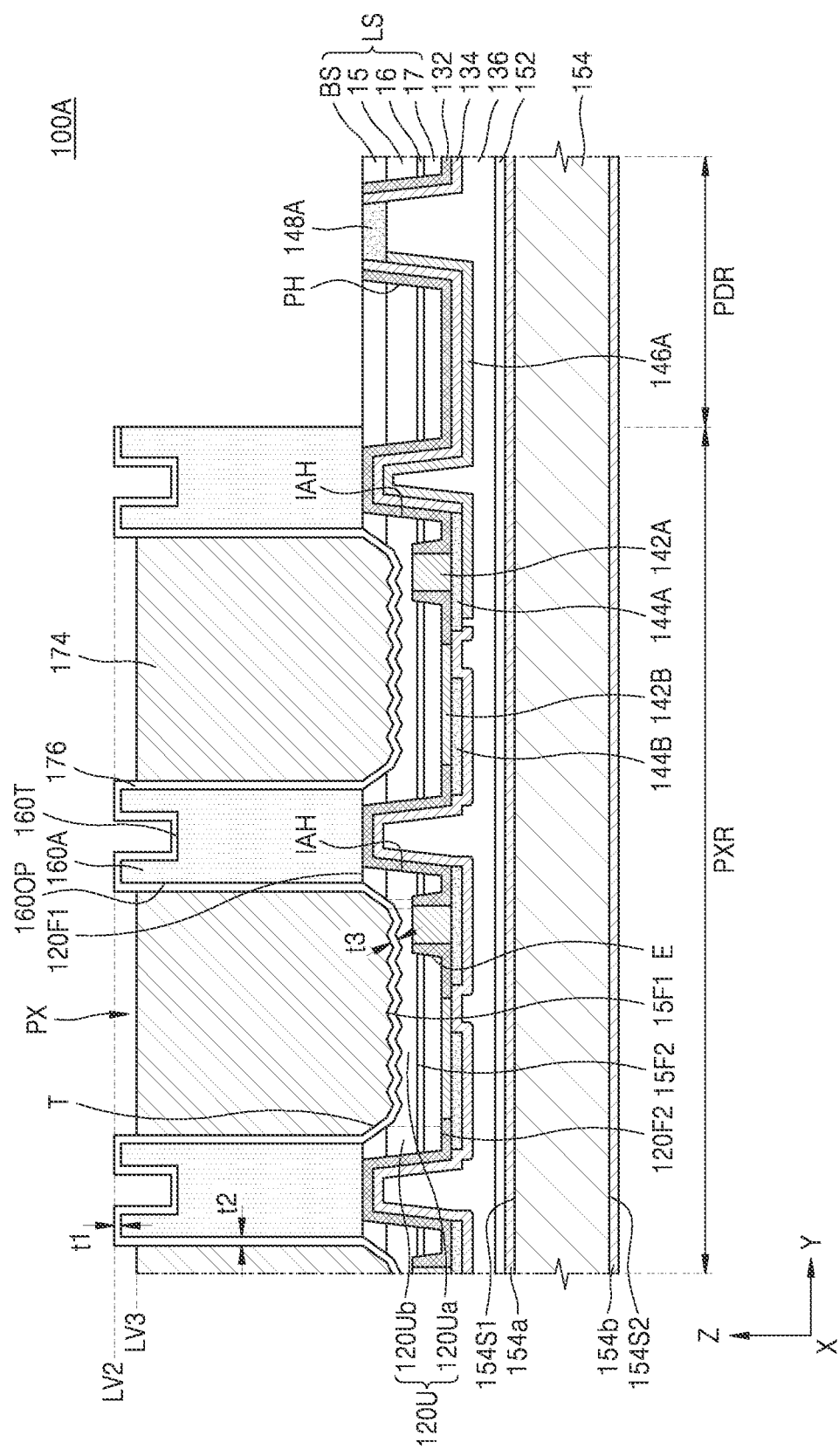
FIG. 8A is a cross-sectional view of a semiconductor light-emitting device according to an embodiment.

FIG. 8A is a cross-sectional view of a semiconductor light-emitting device 100A according to an embodiment. Hereinafter, repeated description elements of the semiconductor light-emitting device 100A that are similar to elements of the semiconductor light-emitting device 100 is omitted for conciseness and differences between the semiconductor light-emitting device 100 described with reference to FIGS. 5 to 7 and the semiconductor light-emitting device 100A of FIG. 8A will be described.

Referring to FIG. 8A, the semiconductor light-emitting device 100A may further include a passivation layer 176 on the partition wall 160A to protect the partition wall 160A. The passivation layer 176 may include an oxide film, a nitride film, or a combination thereof. For example, the passivation layer 176 may include Si$_3$N$_4$, SiO$_2$, SiON, Al$_2$O$_3$, or a combination thereof. In some embodiments, the passivation layer 176 may have a multilayered structure.

The passivation layer 176 may extend on a top surface and a side surface of the partition wall 160A. In some embodiments, the passivation layer 176 may further extend on a light-emitting structure 120U. In some embodiments, a thickness t1 of a portion of the passivation layer 176 on the top surface of the partition wall 160A may be less than a thickness t2 of a portion of the passivation layer 176 on the side surface of the partition wall 160A. The contrast characteristics of the semiconductor light-emitting device 100A may be improved due to a difference in the thickness of the passivation layer 176. In some embodiments, a thickness t3 of a portion of the passivation layer 176 on the light-emitting structure 120U may be less than the thickness t2 of the portion of the passivation layer 176 on the side surface of the partition wall 160A.

In some embodiments, the partition wall 160A may further include a trench 160T, which extends from the top surface of the partition wall 160A into the partition wall 160A. In some embodiments, a top level LV3 of a fluorescent layer 174 may be lower than or equal to a top level LV2 of a partition wall structure 160.

Although not shown in FIG. 8A, in some embodiments, a reflective layer (not shown) may be between the light-emitting structure 120U and a first insulating layer 132 and between the partition wall structure 160 and the first insulating layer 132. In other embodiments, the reflective layer (not shown) may be between the first insulating layer 132 and a second insulating layer 134. In other embodiments, the reflective layer (not shown) may be between the second insulating layer 134 and a filling insulating layer 136.

In some embodiments, an upper insulating film 154$a$ and a lower insulating film 154$b$ may be further provided on both surfaces of the support substrate 154.

The upper insulating film 154$a$ may cover a first surface 154S1 of the support substrate 154, which faces the filling insulating layer 136, and the lower insulating film 154$b$ may cover a second surface 154S2 of the support substrate 154, which is on an opposite side of the first surface 154S1. The upper insulating film 154$a$ may be apart from the filling insulating layer 136 with the adhesive layer 152 therebetween in the vertical direction (Z direction). In example embodiments, the upper insulating film 154$a$ may be in contact with the first surface 154S1 of the support substrate 154, and the lower insulating film 154$b$ may be in contact with the second surface 154S2 of the support substrate 154. However, embodiments are not limited thereto. For example, at least one middle film (not shown) may be between the upper insulating film 154a and the support substrate 154 and/or between the lower insulating film 154b and the support substrate 154. The at least one middle film may include an insulating material, a semiconductor material, a conductive material, or a combination thereof.

Figure 8B:
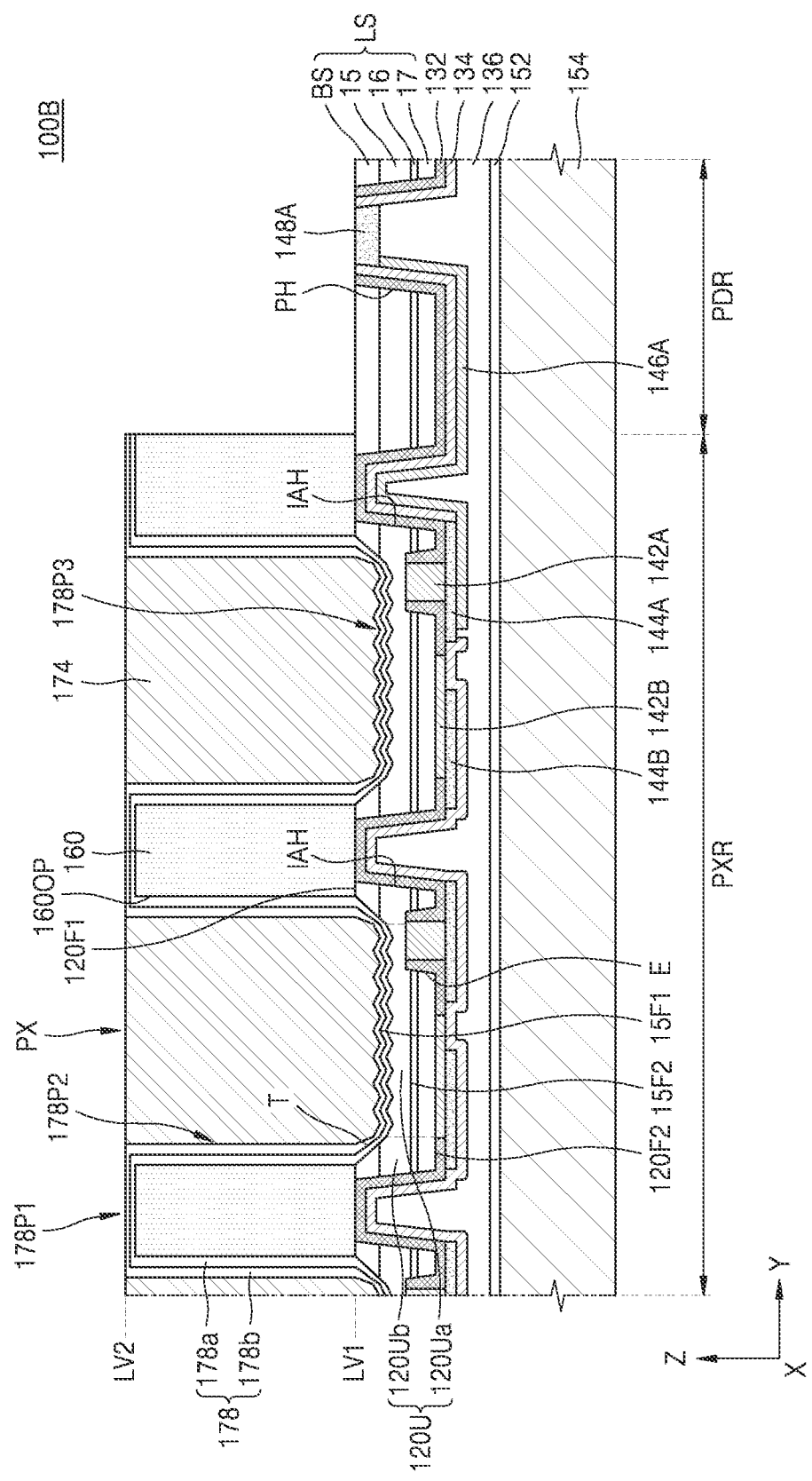
FIG. 8B is a cross-sectional view of a semiconductor light-emitting device according to an embodiment.

FIG. 8B is a cross-sectional view of a semiconductor light-emitting device 100B according to an embodiment. Hereinafter, repeated description elements of the semiconductor light-emitting device 100B that are similar to elements of the semiconductor light-emitting devices 100 and 100A is omitted for conciseness and differences between the semiconductor light-emitting devices 100 and 100A described with reference to FIGS. 5 to 8A and the semiconductor light-emitting device 100B of FIG. 8B will be described.

Referring to FIG. 8B, a passivation structure 178 may be on a top surface and a sidewall of a partition wall structure 160. The passivation structure 178 may include a first passivation layer 178a and a second passivation layer 178b, which are conformally on the top surface and the sidewall of the partition wall structure 160. The passivation structure 178 may be conformally on an exposed portion of the first surface 15F1 of a first-type semiconductor layer 15.

In example embodiments, the first passivation layer 178a may include a first insulating material, and the second passivation layer 178b may include a second insulating material, which is different from the first insulating material. Each of the first insulating material and the second insulating material may include at least one of silicon oxide, silicon nitride, silicon oxynitride, aluminum oxide, and aluminum nitride. Although FIG. 8B illustrates an example in which two passivation layers are provided, it will be understood by one skilled in the art that at least three passivation layers may be provided. In some embodiments, when a plurality of passivation layers are provided, materials of adjacent passivation layers may be differently selected.

In some embodiments, the first passivation layer 178a and the second passivation layer 178b may be repeatedly stacked as pairs of passivation layers at least twice.

In example embodiments, the passivation structure 178 may include a first portion 178P1 positioned on the top surface of the partition wall structure 160, a second portion 178P2 positioned on the sidewall of the partition wall structure 160, and a third portion 178P3 positioned on the exposed portion of the first surface 15F1 of the first-type semiconductor layer 15. In some embodiments, a thickness of the first portion 178P1 may be less than or equal to a thickness of the second portion 178P2. Also, a thickness of the third portion 178P3 may be less than or equal to the thickness of the second portion 178P2. In some embodiments, the first portion 178P1 may have a thickness of about 0.1 μm to about 2 μm, and the second portion 178P2 may have a thickness of about 0.5 μm to 5 μm.

FIGS. 9A to 9M are cross-sectional views illustrating a method of manufacturing a semiconductor light-emitting device, according to an embodiment.

Figure 9A:
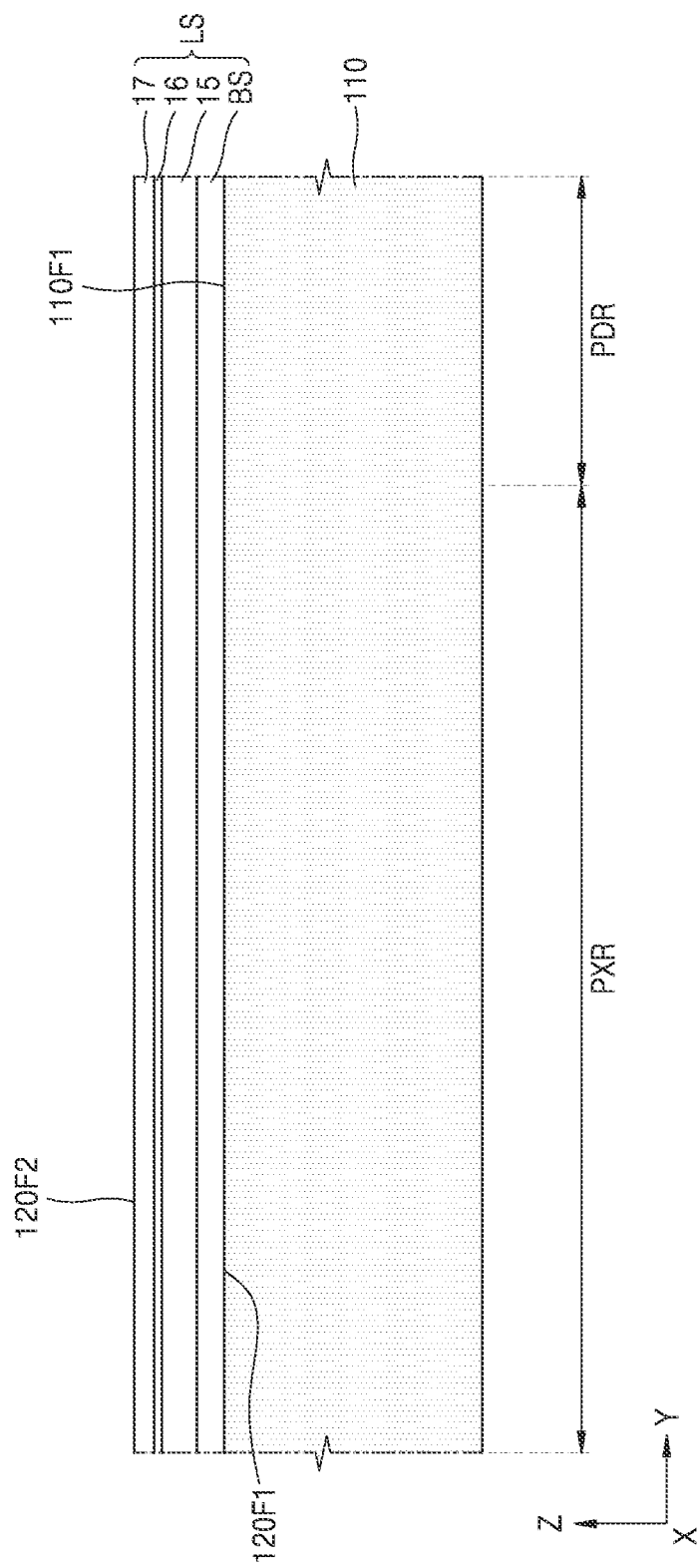

Referring to FIG. 9A, a light-emitting stack LS may be formed on a substrate 110. The substrate 110 may include, for example, a silicon substrate, a silicon carbide substrate, a sapphire substrate, or a gallium nitride substrate. The substrate 110 may include a portion in a pixel region PXR and a portion in a pad region PDR. As described above with reference to FIG. 5, the pad region PDR may surround the pixel region PXR in a view from above. The light-emitting stack LS may be formed by sequentially forming, for example, a buffer structure BS, a first-type semiconductor layer 15, an active layer 16, and a second-type semiconductor layer 17 on the substrate 110. A specific method of forming the light-emitting stack LS has been described above with reference to FIG. 1.

Figure 9B:
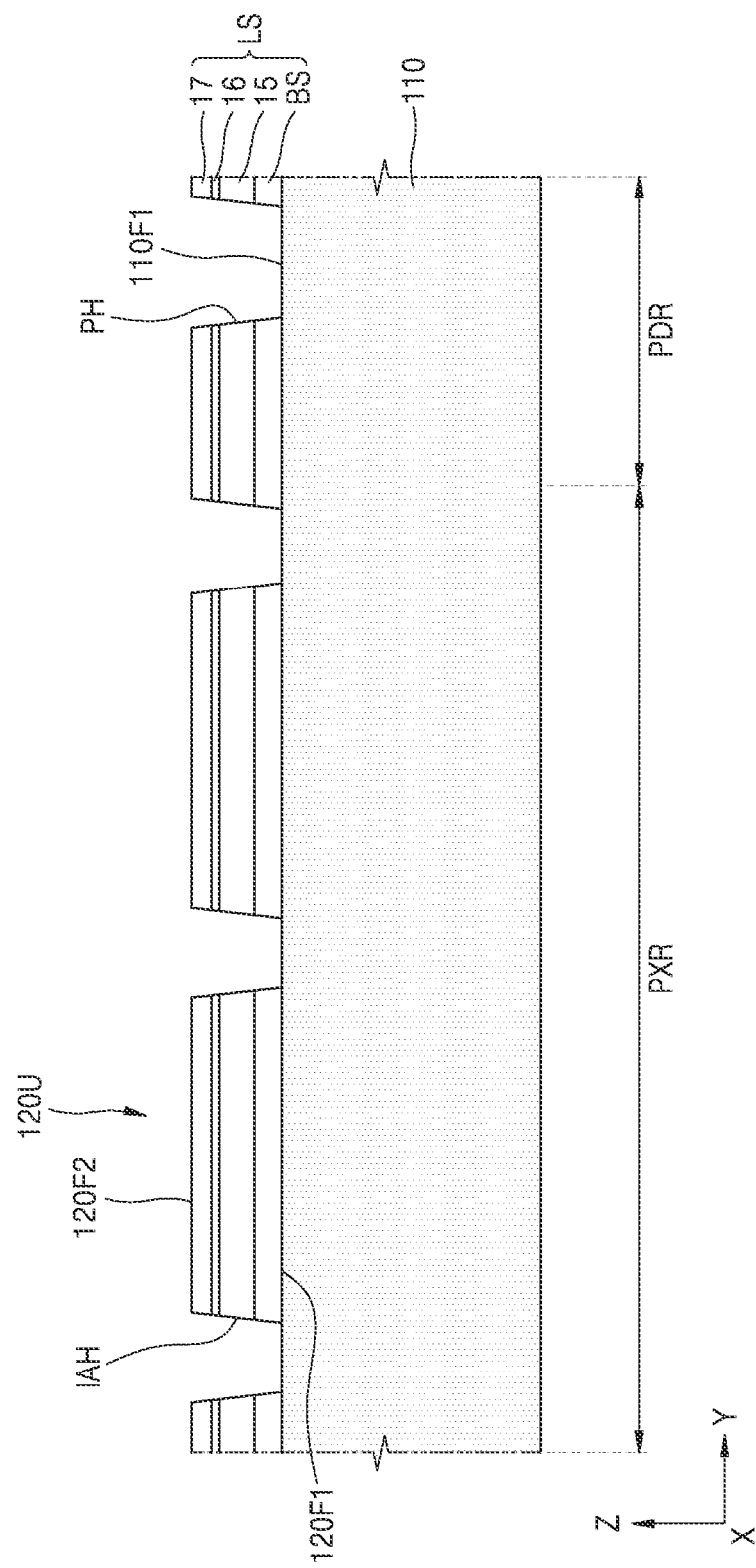

Referring to FIG. 9B, portions of the light-emitting stack LS may be removed to form an isolation opening IAH and a pad opening PH in the pixel region PXR and the pad region PDR, respectively. The isolation opening IAH and the pad opening PH may completely pass through the light-emitting stack LS and expose a first surface 110F1 of the substrate 110. In the pixel region PXR, the light-emitting stack LS may be separated into a plurality of light-emitting structures 120U by the isolation opening IAH. In some embodiments, the process of forming the isolation opening IAH may be performed using a blade.

Figure 9C:
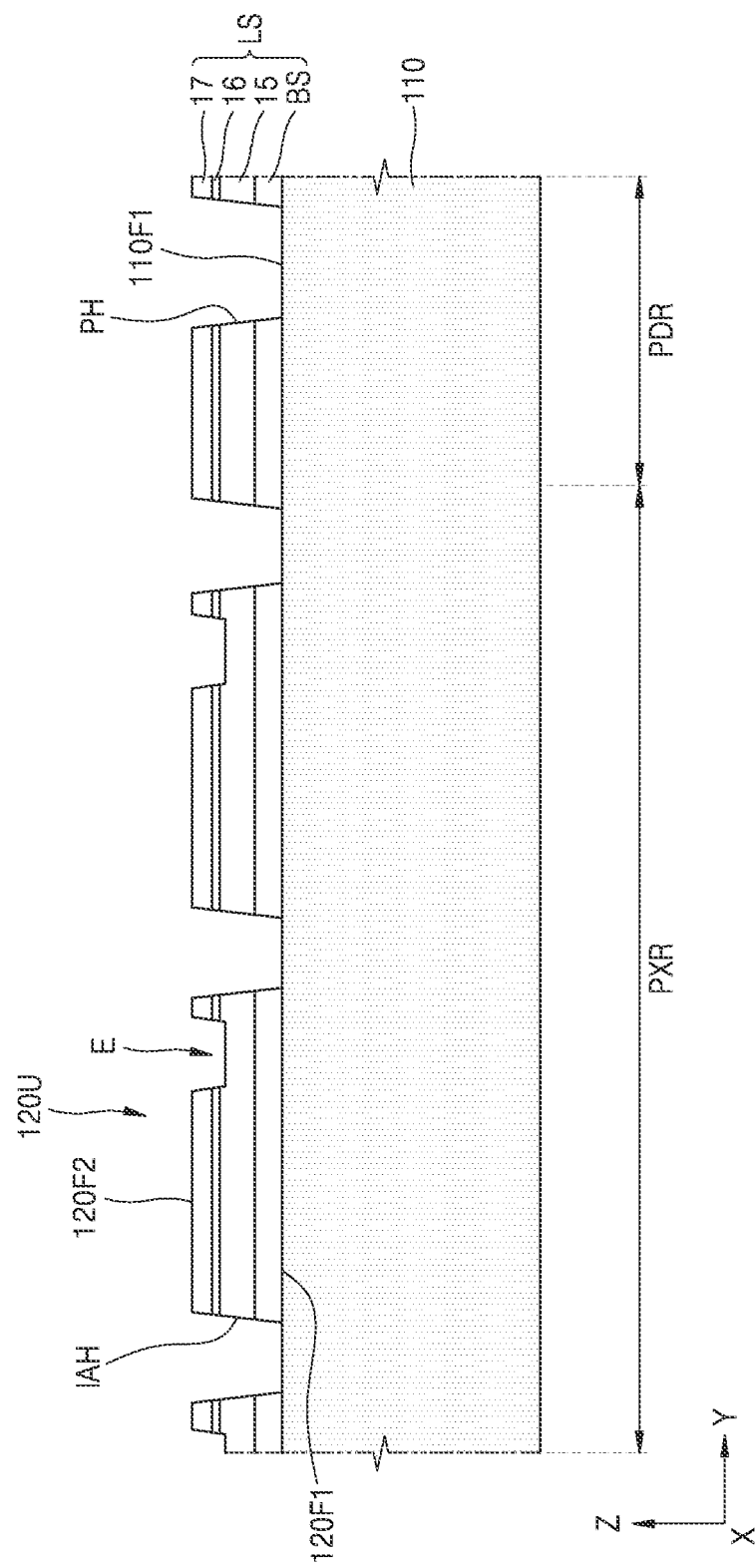

Referring to FIG. 9C, a portion of the light-emitting structure 120U may be removed in the pixel region PXR, and thus, an opening E may be formed in the light-emitting structure 120U. The opening E may pass through the second-type semiconductor layer 17 and the active layer 16 and expose the first-type semiconductor layer 15.

Figure 9D:
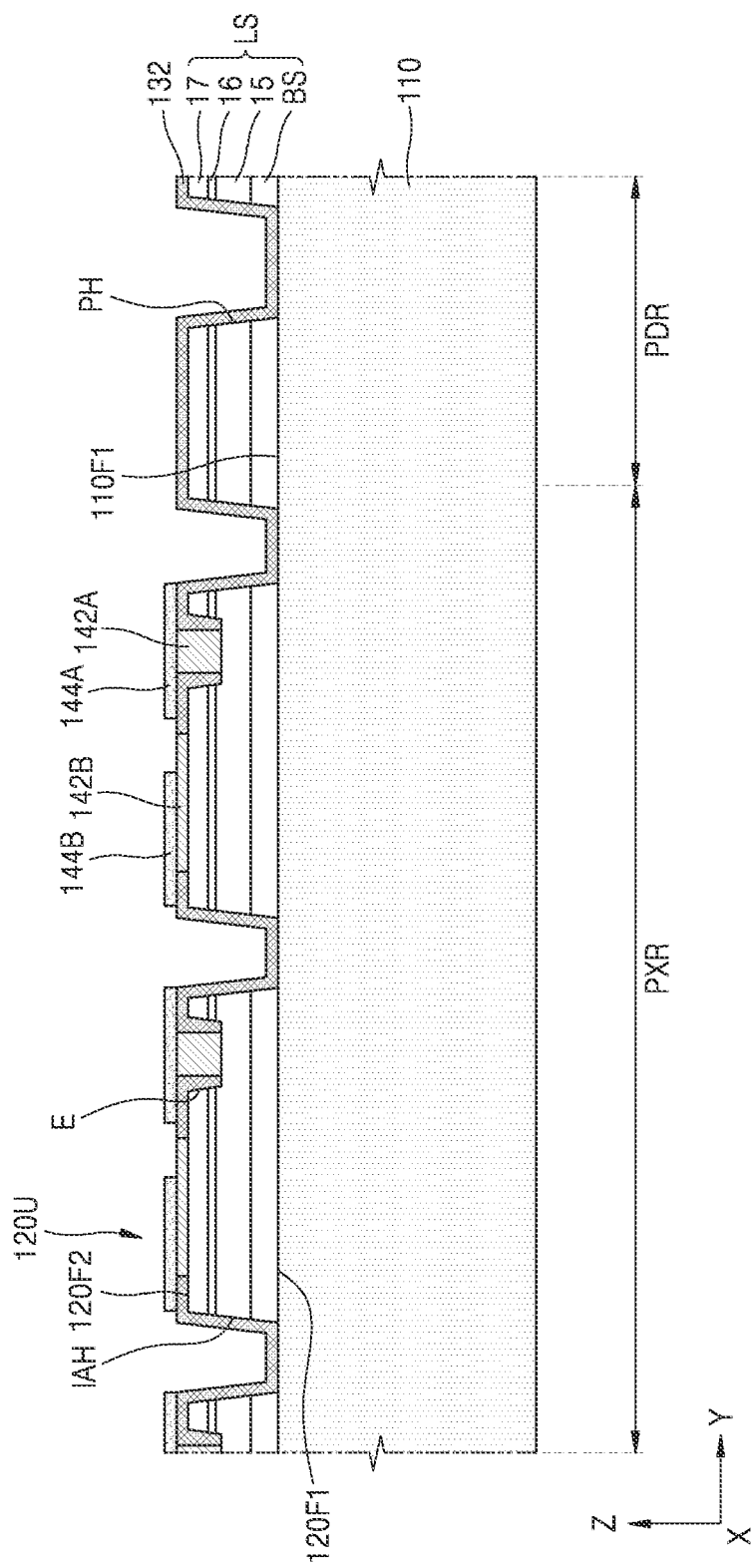

Referring to FIG. 9D, a first insulating layer 132 may be formed on the light-emitting structure 120U, the light-emitting stack LS, and the substrate 110. The first insulating layer 132 may conformally cover the opening E, the isolation opening IAH, and the pad opening PH and extend on a top surface and a side surface of the light-emitting structure 120U and a top surface of the substrate 110. The first insulating layer 132 may be formed in both the pixel region PXR and the pad region PDR.

Next, a portion of the first insulating layer 132 on the first-type semiconductor layer 15 positioned inside the opening E may be removed to expose a top surface of the first-type semiconductor layer 15. Next, a first electrode 142A may be formed on the top surface of the first-type semiconductor layer 15. In some embodiments, a first contact layer (not shown) including an ohmic material may be further formed between the first electrode 142A and the first-type semiconductor layer 15. Next, a first connection electrode 144A to be electrically connected to the first electrode 142A may be formed on the first insulating layer 132.

Moreover, a portion of the first insulating layer 132 on the second-type semiconductor layer 17 may be removed to expose a top surface of the second-type semiconductor layer 17. A second electrode 142B may be formed on the top surface of the second-type semiconductor layer 17. In some embodiments, a second contact layer (not shown) including an ohmic material may be further formed between the second electrode 142B and the second-type semiconductor layer 17. Next, a second connection electrode 144B to be electrically connected to the second electrode 142B may be formed on the first insulating layer 132.

Figure 9E:
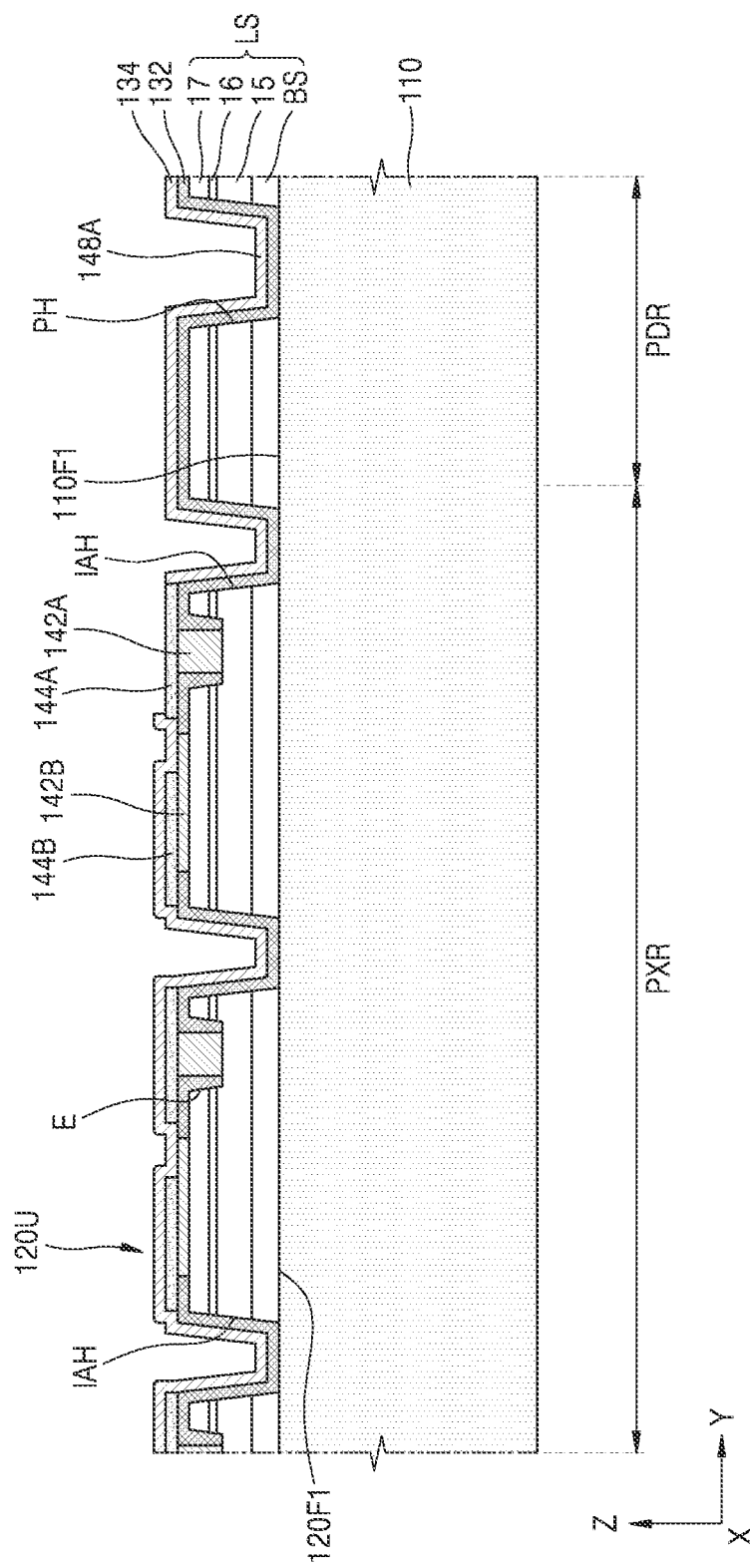

Referring to FIG. 9E, a second insulating layer 134 may be conformally formed on the first connection electrode 144A, the second connection electrode 144B, and the first insulating layer 132.

Figure 9F:
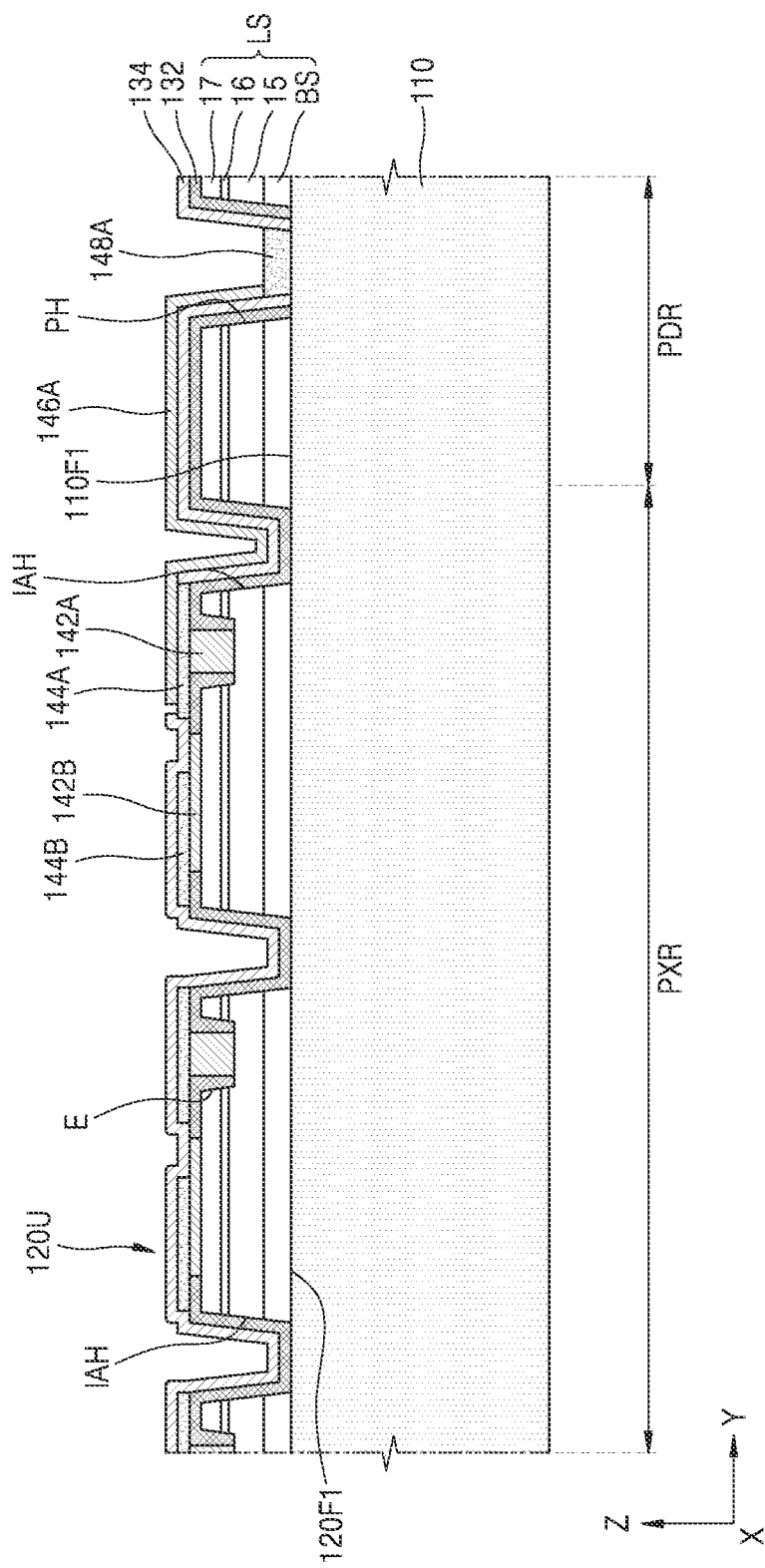

Referring to FIG. 9F, a portion of the second insulating layer 134 may be removed to expose a top surface of the first connection electrode 144A. In addition, portions of the first insulating layer 132 and the second insulating layer 134, which are exposed through the pad opening PH, may be removed to expose the first surface 110F1 of the substrate 110. Subsequently, a first wiring pattern 146A may be formed on the second insulating layer 134. Also, a first pad 148A may be formed inside the pad opening PH. In some embodiments, forming the first wiring pattern 146A may be followed by forming the first pad 148A. In other embodiments, the first pad 148A may be formed during the formation of the first wiring pattern 146A. Although not shown in FIG. 9F, a second wiring pattern (refer to 146B in FIG. 6) may be further formed on the second insulating layer 134, and a second pad (refer to 148B in FIG. 6) may be further formed inside another pad opening PH.

Referring to FIG. 9G, a filling insulating layer 136 may be formed on the second insulating layer 134, the first wiring pattern 146A, and the first pad 148A. The filling insulating layer 136 may fill the remaining spaces inside the isolation opening IAH and the pad opening PH. Thereafter, the filling insulating layer 136 may be adhered to a support substrate 154 by using an adhesive layer 152.

Figure 9H:
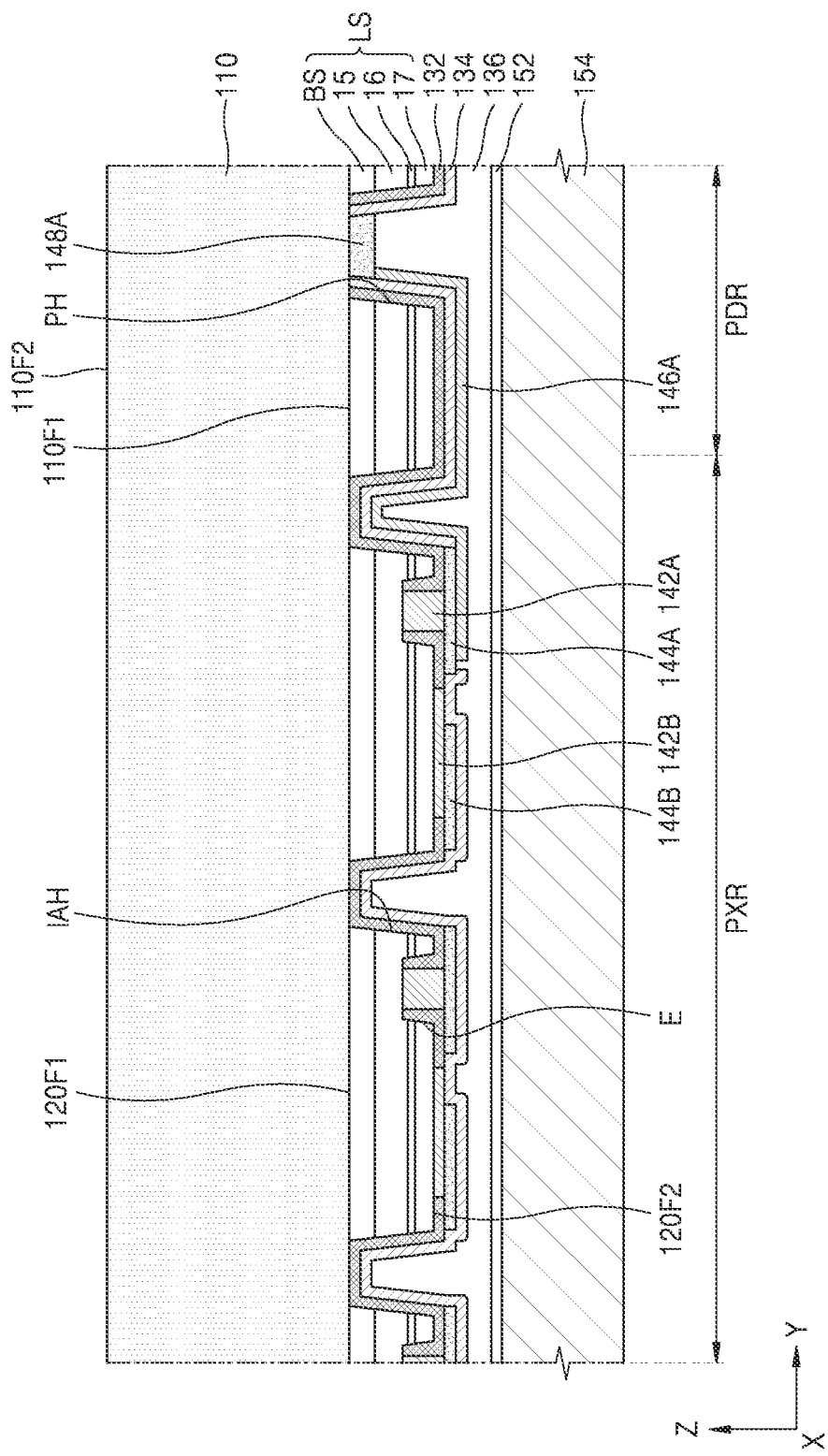

Referring to FIG. 9H, an upper portion of the substrate 110 may be removed from the second surface 110F2 of the substrate 110 by using a grinding process, and thus, a thickness of the substrate 110 may be reduced.

Referring to FIG. 9I, a mask pattern (not shown) may be formed on the second surface 110F2 of the substrate 110, and a portion of the substrate 110 may be removed using the mask pattern as an etch mask, and thus, a plurality of openings 1600P may be formed in the pixel region PXR of the substrate 110 to pass through the substrate 110. The plurality of openings 1600P may respectively expose portions of the first surface 120F1 of the plurality of light-emitting structures 120U. The opening 1600P may be formed such that the substrate 110 overlaps a peripheral portion of a light-emitting structure 120U and exposes a central portion of the light-emitting structure 120U.

Figure 9J:
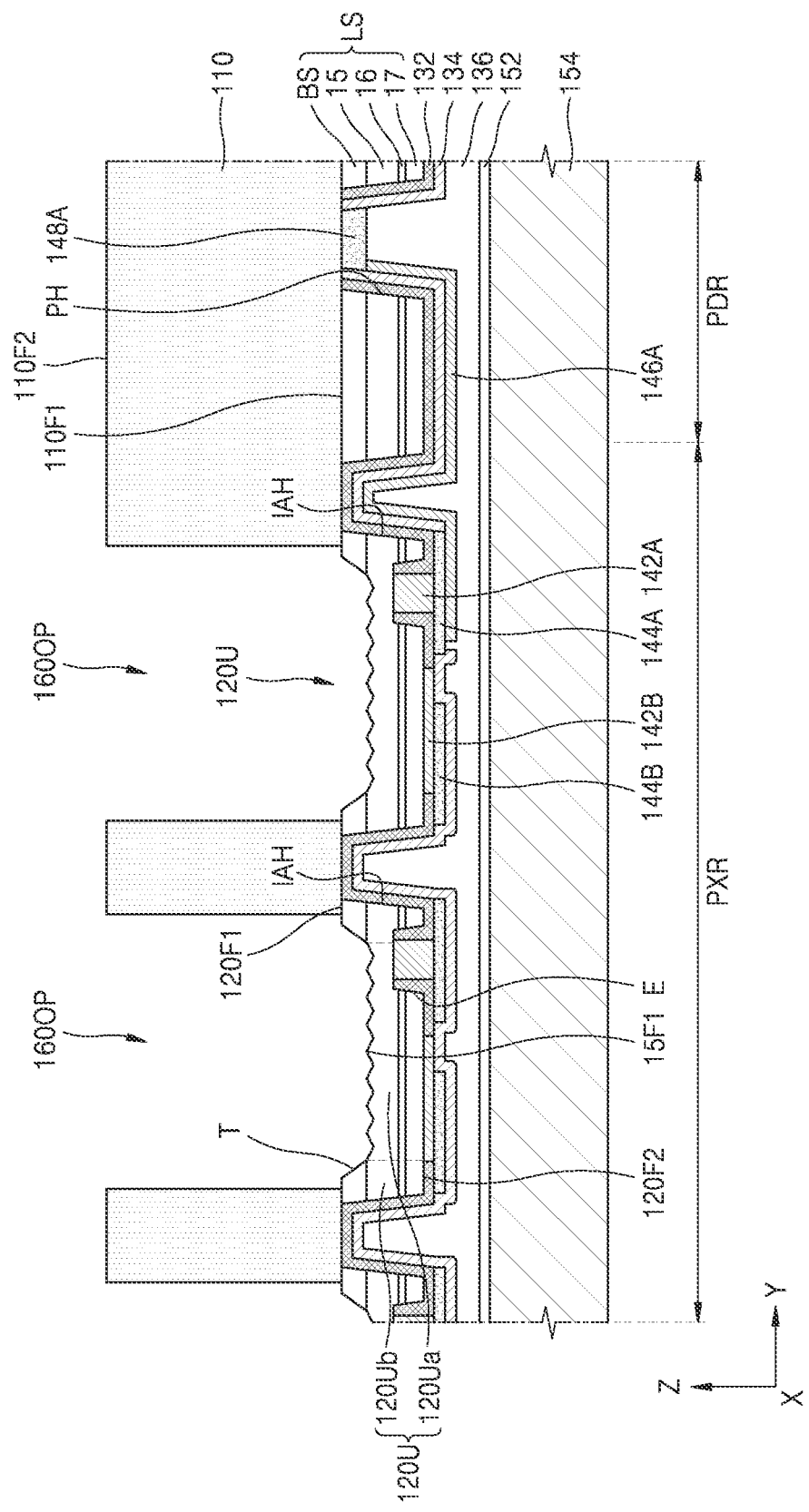

Referring to FIG. 9J, portions of the buffer structure BS, which are exposed by the plurality of openings 1600P, may be etched to form a trench T in each of the light-emitting structures 120U. The trench T may expose the first-type semiconductor layer 15. A portion of the buffer structure BS inside a central portion 120Ua of the light-emitting structure 120U, which is exposed by the opening 1600P of the substrate 110, may be removed. A portion of the buffer structure BS may remain at a peripheral portion 120Ub of the light-emitting structure 120U, which is covered by the substrate 110. In some embodiments, an exposed portion of the first surface 15F1 of the first-type semiconductor layer 15 may be textured and roughened.

During the formation of the opening 1600P in the substrate 110 and the formation of the trench T in the light-emitting structure 120U, cracks may occur in the buffer structure BS (esp., a layer including AlN) under tensile stress, and propagate into a portion of the buffer structure BS, which remains under the substrate 110, thereby causing defects in the semiconductor light-emitting device. The buffer structures BS and BS-2 structurally configured as described with reference to FIGS. 1 to 4 may reduce tensile stress therein and prevent cracks from occurring, and thus, the manufacturing yield of a semiconductor light-emitting device (refer to 100 in FIGS. 5 to 7) may be improved.

Figure 9K:
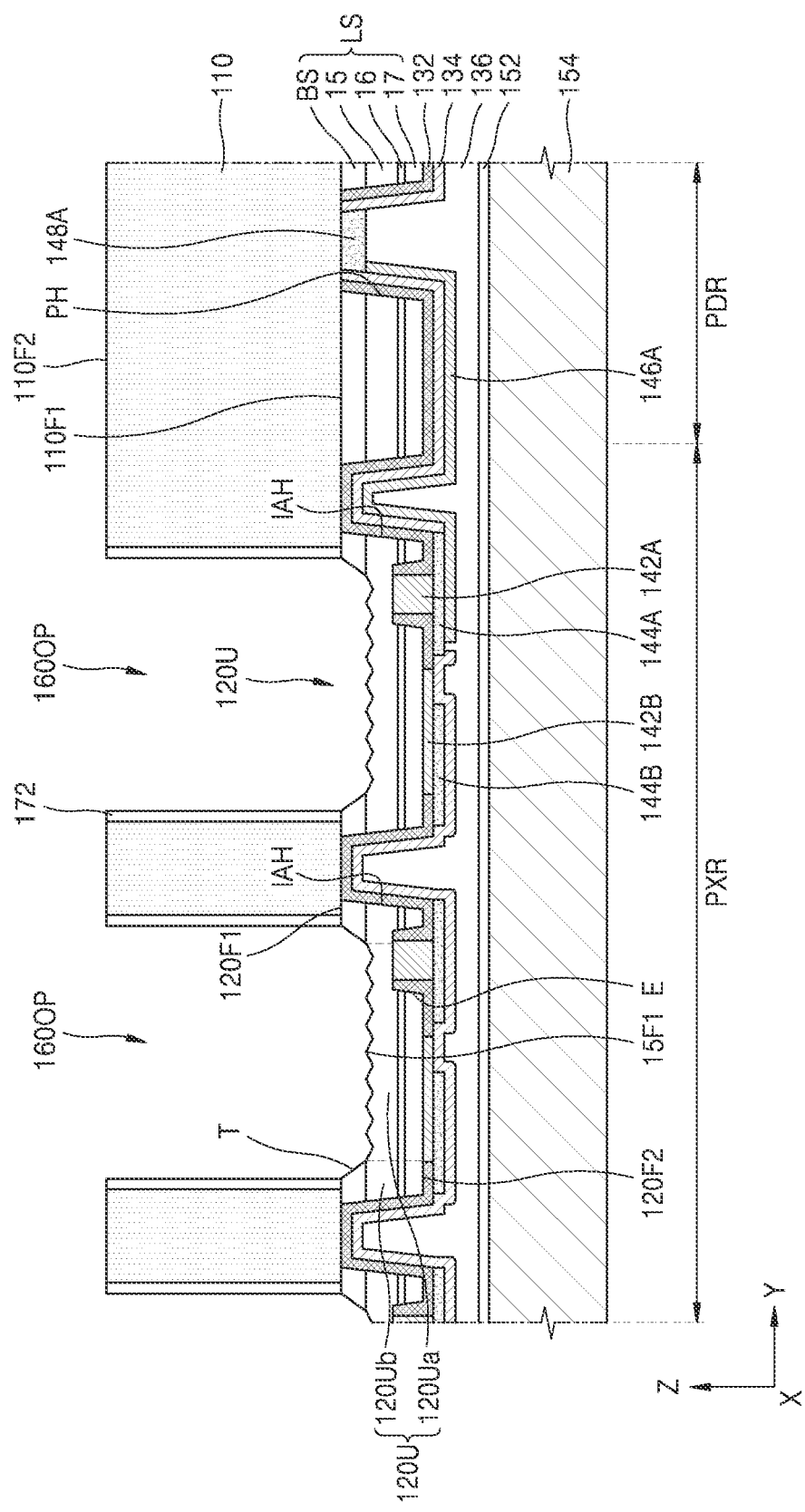
Figure 9L:
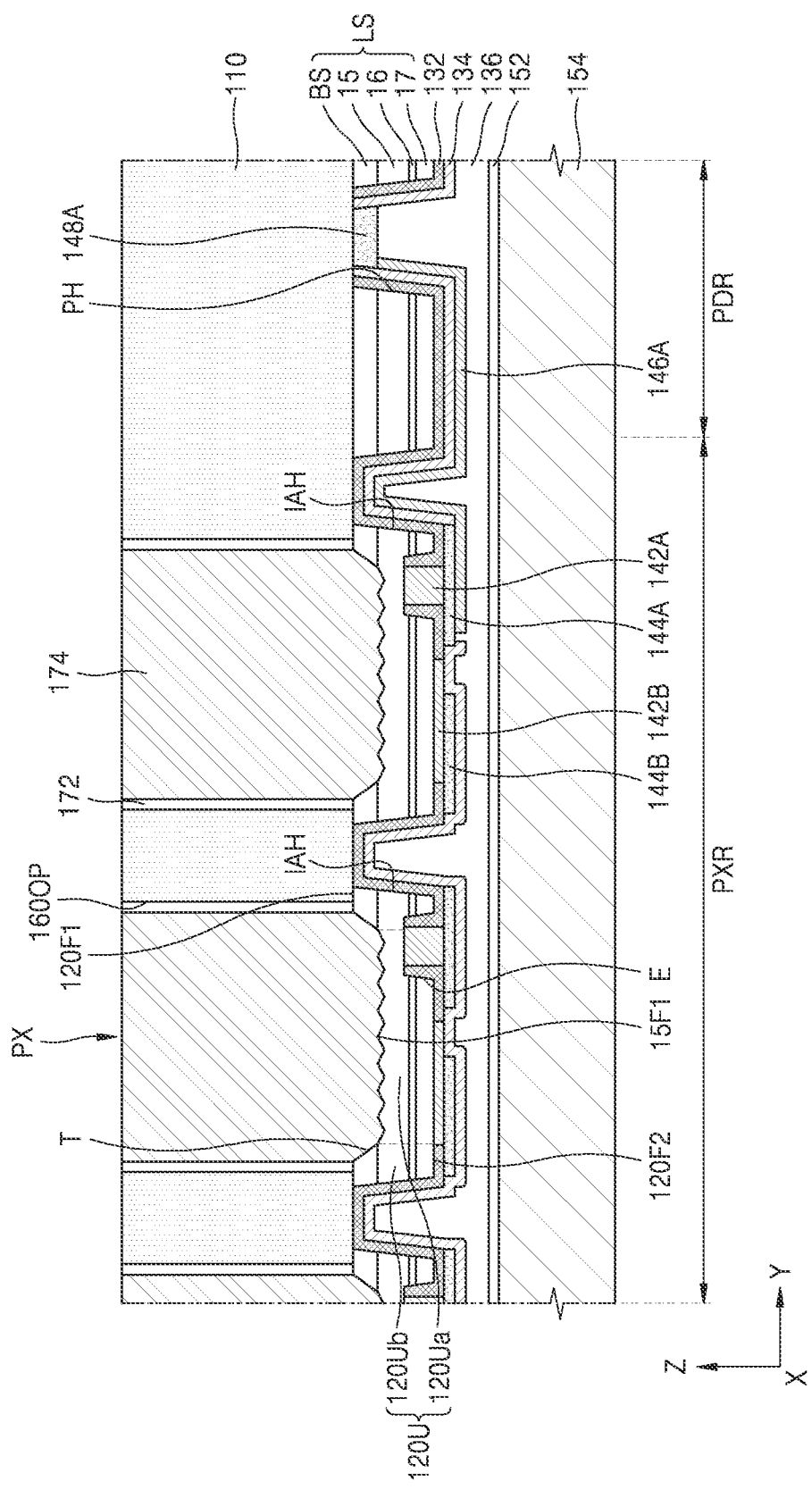

Referring to FIG. 9K, a reflective layer 172 may be formed on side surfaces of the plurality of openings 1600P of the substrate 110. For example, a metal layer may be formed on the substrate 110 and the light-emitting structure 120U and then removed from the top surface of the substrate 110 and the light-emitting structure 120U by using an anisotropic etching process.

Referring to FIG. 9I, a fluorescent layer 174 may be formed inside the trench T of the light-emitting structure 120U and the opening 1600P of the substrate 110. For example, the fluorescent layer 174 may be formed by applying or dispensing a resin containing fluorescent material particles dispersed therein into the opening 1600P and the trench T. The fluorescent layer 174 may include at least two kinds of fluorescent material particles having different size distributions so that the fluorescent material particles may be uniformly dispersed in each of the opening 1600P and the trench T.

Referring to FIG. 9M, a mask pattern M11 may be formed on a portion of the substrate 110 in the pixel region PXR to expose a portion of the substrate 110 in the pad region PDR. A portion of the substrate 110 may be removed using the mask pattern M11 as an etch mask to expose the light-emitting stack LS and the first pad 148A in the pad region PDR. Although not shown in FIG. 9M, the second pad 148B may also be exposed. Thereafter, the mask pattern M11 may be removed. The substrate 110 having the plurality of openings 1600P may form a partition wall structure (refer to 160 in FIGS. 5 to 7).

The semiconductor light-emitting device 100 of FIGS. 5 to 7 may be completely manufactured by using the manufacturing method described with reference to FIGS. 9A to 9M.

Figure 10:
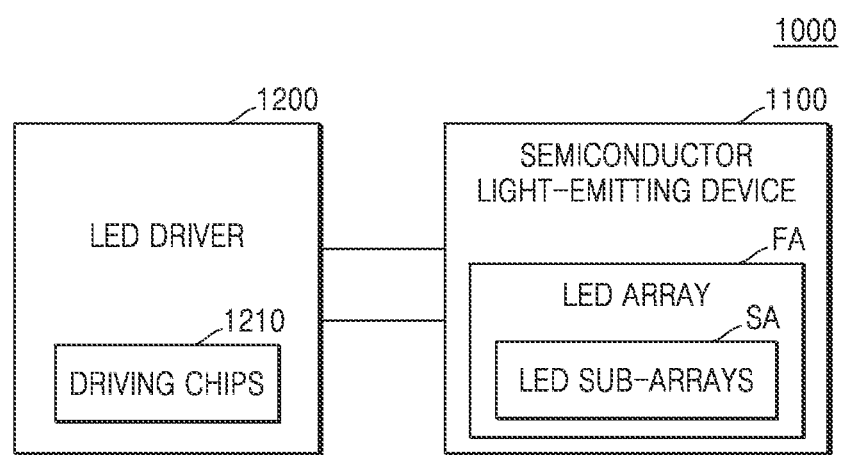
FIG. 10 is a block diagram of a light source module according to an embodiment.

FIG. 10 is a block diagram of a light source module 1000 according to an embodiment.

Referring to FIG. 10, the light source module 1000 may include a semiconductor light-emitting device 1100 and an LED driver 1200. The semiconductor light-emitting device 1100 may include an LED array FA including a plurality of LEDs. In some embodiments, one LED array FA may include a plurality of sub-arrays SA. LEDs included in different sub-arrays SA may be electrically isolated from each other. The semiconductor light-emitting device 1100 may be, for example, one of the semiconductor light-emitting devices 10, 10-1, 10-2, 100, 100A, and 100B described with reference to FIGS. 1 to 8B.

The LED driver 1200 may include a plurality of driving chips 1210. Each of the plurality of driving chips 1210 may include an integrated circuit (IC) chip. Each of the plurality of driving chips 1210 may be electrically connected to the sub-array SA corresponding thereto and control operations of the LEDs of the sub-array SA corresponding thereto. In some embodiments, the number of driving chips 1210 included in the LED driver 1200 may be equal to the number of sub-arrays SA included in the semiconductor light-emitting device 1100. In other embodiments, the number of driving chips 1210 included in the LED driver 1200 may be different from the number of sub-arrays SA included in the semiconductor light-emitting device 1100. For example, a plurality of sub-arrays SA may be controlled by one driving chip 1210 or one sub-array SA may be controlled by a plurality of driving chips 1210.

Unlike the illustration of FIG. 10, in some embodiments, the LED array FA in the semiconductor light-emitting device 1100 may not be separated into a plurality of sub-arrays SA. That is, in some embodiments, the plurality of sub-arrays SA may be omitted. Each of the driving chips 1210 may control operations of LEDs in an array FA corresponding thereto. In some embodiments, the number of driving chips 1210 included in the LED driver 1200 may be equal to the number of arrays included in the semiconductor light-emitting device 1100.

The LED driver 1200 may be connected to a power supply (not shown). The power supply may generate an input voltage required for operations of the semiconductor light-emitting device 1100 and provide the input voltage to the semiconductor light-emitting device 1100. In an embodiment, when the light source module 1000 is a headlamp for a vehicle, and the power supply may be a battery mounted in the vehicle. According to some embodiments, when the light source module 1000 is a household or industrial lighting fixture, the light source module 1000 may further include an alternating-current (AC) power supply configured to generate an AC voltage, a rectifying circuit configured to rectify the AC voltage and generate a direct-current (DC) voltage, and a voltage regulating circuit.

Figure 11:
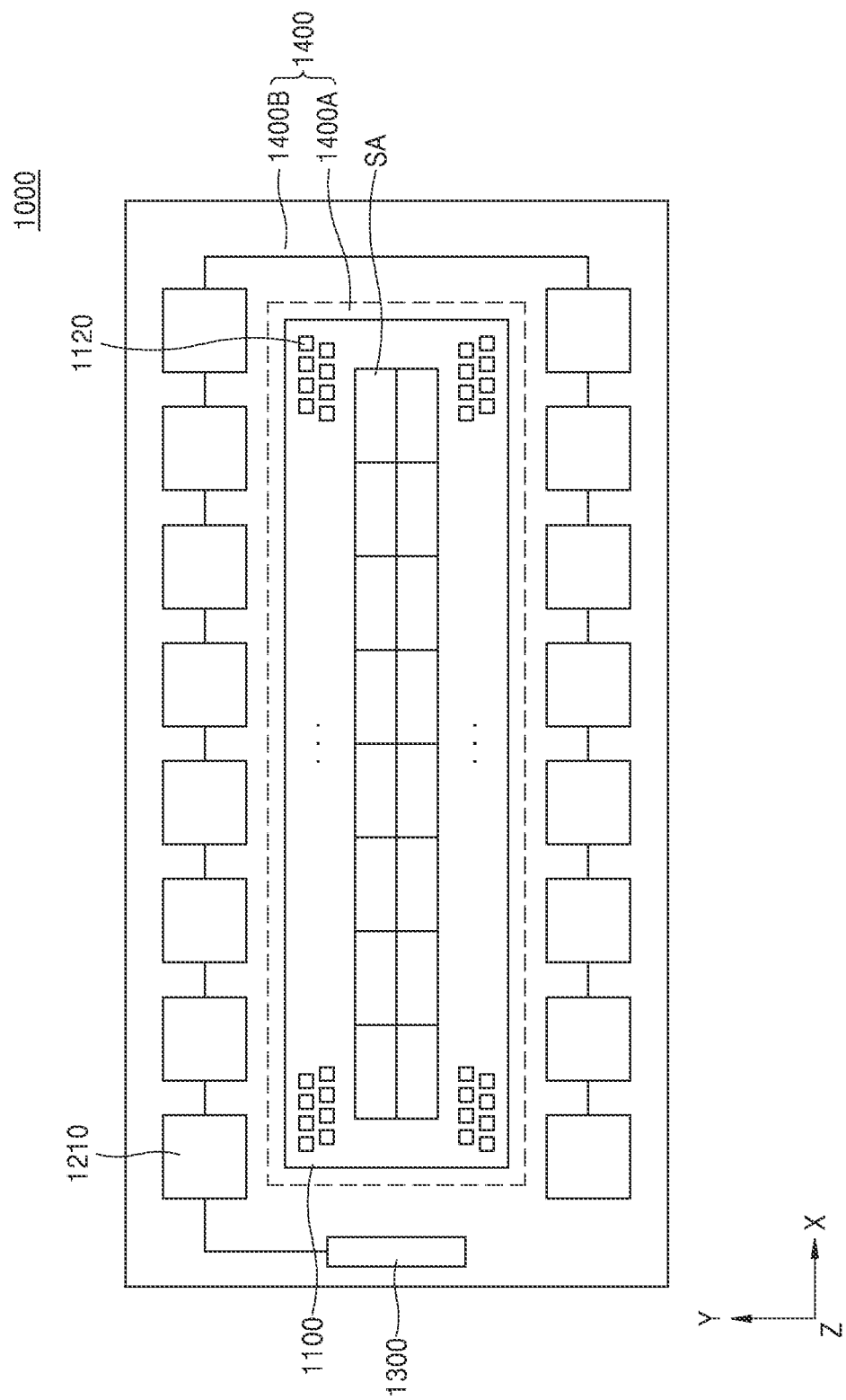
FIG. 11 is a plan view of a light source module according to an embodiment.

FIG. 11 is a plan view of a light source module 1000 according to an embodiment.

Referring to FIG. 11, the light source module 1000 may include a circuit substrate 1400 and a semiconductor light-emitting device 1100 and a plurality of driving chips 1210, which are mounted on the circuit substrate 1400. In some embodiments, the semiconductor light-emitting device 1100 may include one chip. In some embodiments, an X-directional length of the semiconductor light-emitting device chip 1100 may be greater than a Y-directional length of the semiconductor light-emitting device chip 1100.

The circuit substrate 1400 may be, for example, a printed circuit board (PCB). The circuit substrate 1400 may include a central area 1400A and a peripheral area 1400B surrounding the central area 1400A. In some embodiments, the semiconductor light-emitting device 1100 may be on the central area 1400A of the circuit substrate 1400, and the plurality of driving chips 1210 may be on the peripheral area 1400B of the circuit substrate 1400.

The semiconductor light-emitting device 1100 may include an LED array. The LED array may be separated into a plurality of sub-arrays SA. Although FIG. 11 illustrates a case in which the semiconductor light-emitting device 1100 includes 16 sub-arrays SA, the number of sub-arrays SA included in the semiconductor light-emitting device 1100 may be greater or less than 16. In addition, although FIG. 11 illustrates a case in which the sub-arrays SA are arranged in 8 columns and 2 rows, the arrangement of sub-arrays SA may be modified. Each of the sub-arrays SA may be driven by a corresponding one of the driving chips 1210. In the semiconductor light-emitting device 100 described with reference to FIGS. 5 to 7, one light-emitting structure 120U may correspond to one LED.

The light source module 1000 may further include an input unit 1300 configured to receive signals for operating the light source module 1000 from the outside of the light source module 1000. For example, the plurality of driving chips 1210 may receive a control signal for controlling respective operations of the plurality of sub-arrays SA through the input unit 1300. Also, the plurality of driving chips 1210 may receive driving power through the input unit 1300. In some embodiments, the plurality of driving chips 1210 may be sequentially electrically connected to each other. Accordingly, for example, the control signal may be sequentially transmitted from the input unit 1300 to the plurality of driving chips 1210.

Pads 1120 configured to connect the semiconductor light-emitting device 1100 to the plurality of driving chips 1210 may be arranged on an emission surface through which the semiconductor light-emitting device 1100 emits light. Each of the pads 1120 may be the first pad 148A or the second pad 148B, which is described with reference to FIGS. 5 to 7. In the semiconductor light-emitting device 100 described with reference to FIGS. 5 to 7, the emission surface may be the first surface 120F1 of the light-emitting structure 120. However, in other embodiments, the pads 1120 may be arranged on an opposite surface of the emission surface.

Figure 12:
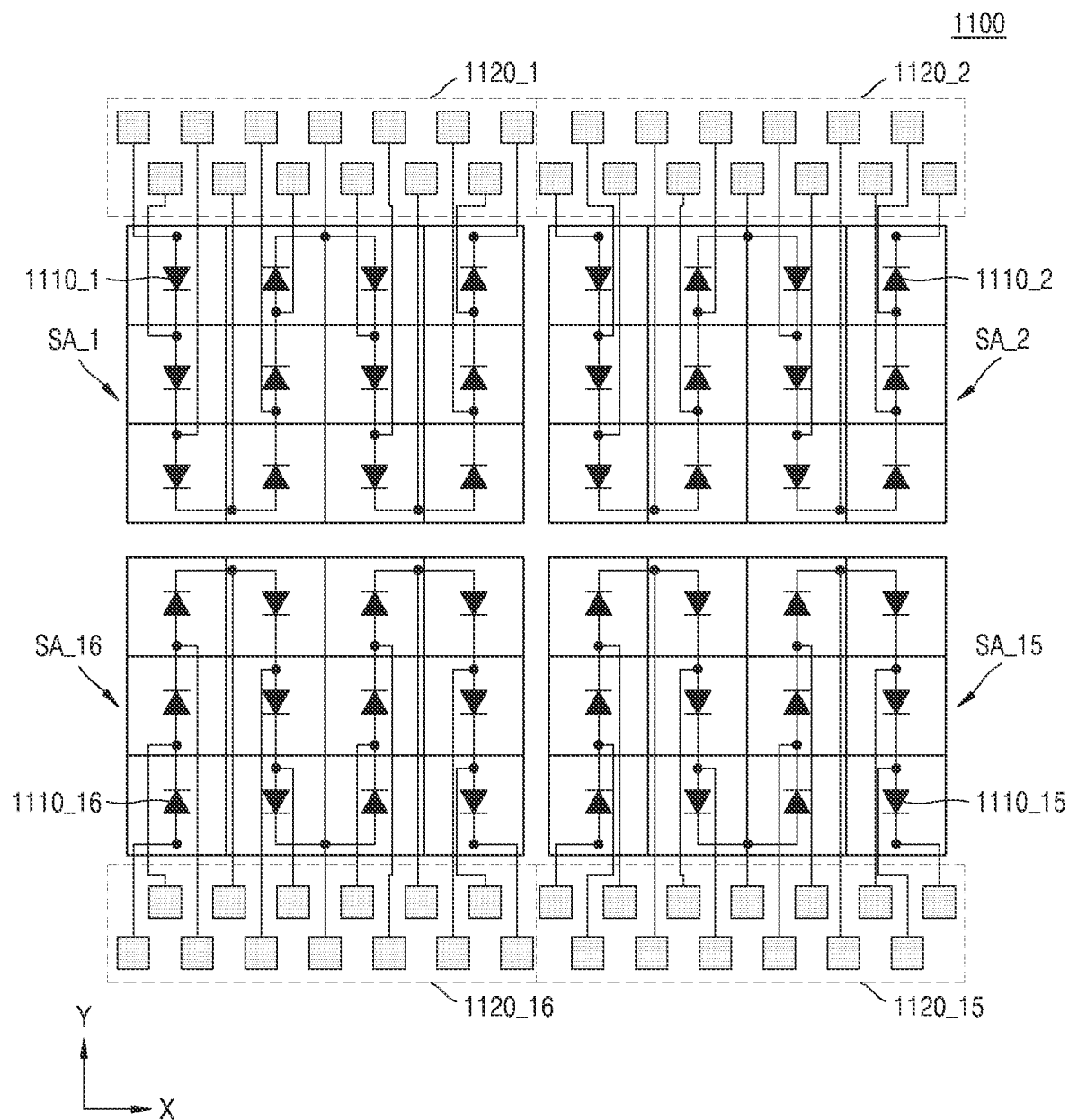
FIG. 12 is a circuit diagram of a semiconductor light-emitting device according to an embodiment.

FIG. 12 is a circuit diagram of a semiconductor light-emitting device 1100 according to an embodiment.

Referring to FIG. 12, the semiconductor light-emitting device 1100 may include a plurality of sub-arrays SA (e.g., a first sub-array SA_1, a second sub-array SA_2, a third sub-array SA_15, and a fourth sub-array SA_16). The first sub-array SA_1, the second sub-array SA_2, the third sub-array SA_15, and the fourth sub-array SA_16 may respectively include a plurality of first LEDs 1110_1, a plurality of second LEDs 1110_2, a plurality of third LEDs 1110_15, and a plurality of fourth LEDs 1110_16. Although FIG. 12 illustrates an example in which the first to fourth sub-arrays SA_1, SA_2, SA_15, and SA_16 include 16 first LEDs 1110_1, 16 second LEDs 1110_2, 16 third LEDs 1110_15, and 16 fourth LEDs 1110_16, respectively, in various embodiments the numbers of first LEDs 1110_1, second LEDs 1110_2, third LEDs 1110_15, and fourth LEDs 1110_16 that are respectively included in the first to fourth sub-arrays SA_1, SA_2, SA_15, and SA_16 may be changed. Although FIG. 12 illustrates an example in which the first LEDs 1110_1, the second LEDs 1110_2, the third LEDs 1110_15, and the fourth LEDs 1110_16 are respectively provided in the same number in the first to fourth sub-arrays SA_1, SA_2, SA_15, and SA_16, in various embodiments the numbers of the first LEDs 1110_1, the second LEDs 1110_2, the third LEDs 1110_15, and the fourth LEDs 1110_16 respectively included in first to fourth sub-arrays SA_1, SA_2, SA_15, and SA_16 may not necessarily be the same. For example, in some embodiments, the first sub-array SA_1 may include 12 first LEDs 1110_1, and the second sub-array SA_2 may include 16 second LEDs 1110_2.

The first LEDs 1110_1, the second LEDs 1110_2, the third LEDs 1110_15, and the fourth LEDs 1110_16 may not be connected to each other. The plurality of first LEDs 1110_1 in the first sub-array SA_1 may be connected in series to each other, and both ends of each of the first LEDs 1110_1 may be connected to two first pads 1120_1, respectively. Similarly, the plurality of second LEDs 1110_2 in the second sub-array SA_2 may be connected in series to each other, and both ends of each of the second LEDs 1110_2 may be connected to two second pads 1120_2, respectively. The plurality of third LEDs 1110_15 in the third sub-array SA_15 may be connected in series to each other, and both ends of each of the third LEDs 1110_15 may be connected to two third pads 1120_15, respectively. The plurality of fourth LEDs 1110_16 in the fourth sub-array SA_16 may be connected in series to each other, and both ends of each of the fourth LEDs 1110_16 may be connected to two fourth pads 1120_16, respectively.

In some embodiments in which the LEDs are connected in series, the semiconductor light-emitting device 1100 may further include a zener diode (not shown) configured to protect an LED. Zener diodes may be connected in an reverse direction to the LEDs. In some embodiments, both ends of the zener diode may be respectively connected to both ends of an LED corresponding thereto.

Figure 13:
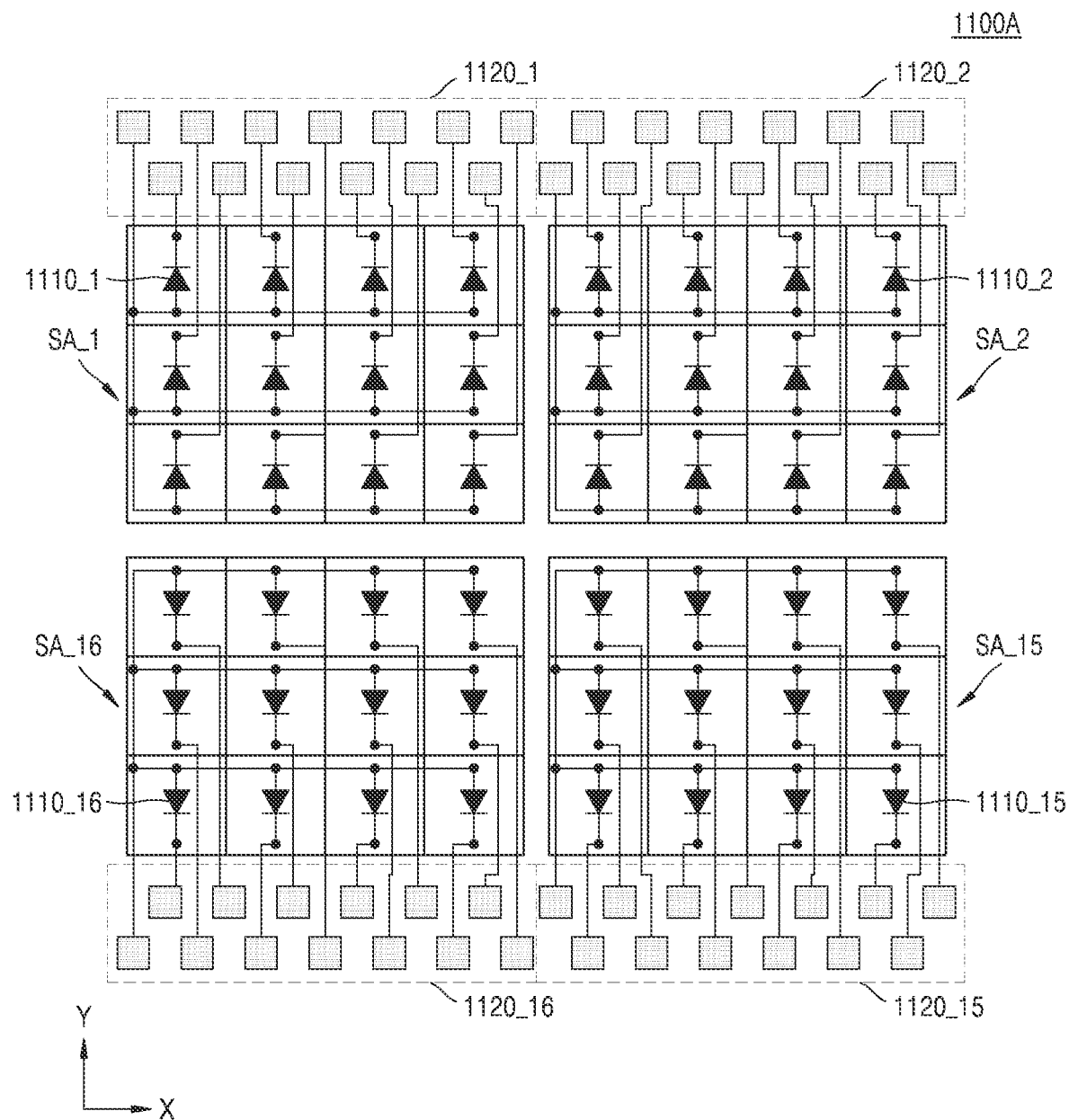
FIG. 13 is a circuit diagram of a semiconductor light-emitting device according to an embodiment.

FIG. 13 is a circuit diagram of a semiconductor light-emitting device 1100A according to an embodiment. Hereinafter, repeated description elements of the semiconductor light-emitting device 1100A that are similar to elements of the semiconductor light-emitting device 1100 of FIG. 12 is omitted for conciseness and differences between the semiconductor light-emitting device 1100 described with reference to FIG. 12 and the semiconductor light-emitting device 1100A of FIG. 13 will be described.

Referring to FIG. 13, a plurality of first LEDs 1110_1 in a first sub-array SA_1 may be connected in parallel to each other, and both ends of each of the first LEDs 1110_1 may be connected to two first pads 1120_1, respectively. Similarly, a plurality of second LEDs 1110_2 in a second sub-array SA_2 may be connected in parallel to each other, and both ends of each of the second LEDs 1110_2 may be connected to two second pads 1120_2, respectively. A plurality of third LEDs 1110_15 in a third sub-array SA_15 may be connected in parallel to each other, and both ends of each of the third LEDs 1110_15 may be connected to two third pads 1120_15, respectively. A plurality of fourth LEDs 1110_16 in a fourth sub-array SA_16 may be connected in parallel to each other, and both ends of each of the fourth LEDs 1110_16 may be connected to two fourth pads 1120_16, respectively.

Figure 14:
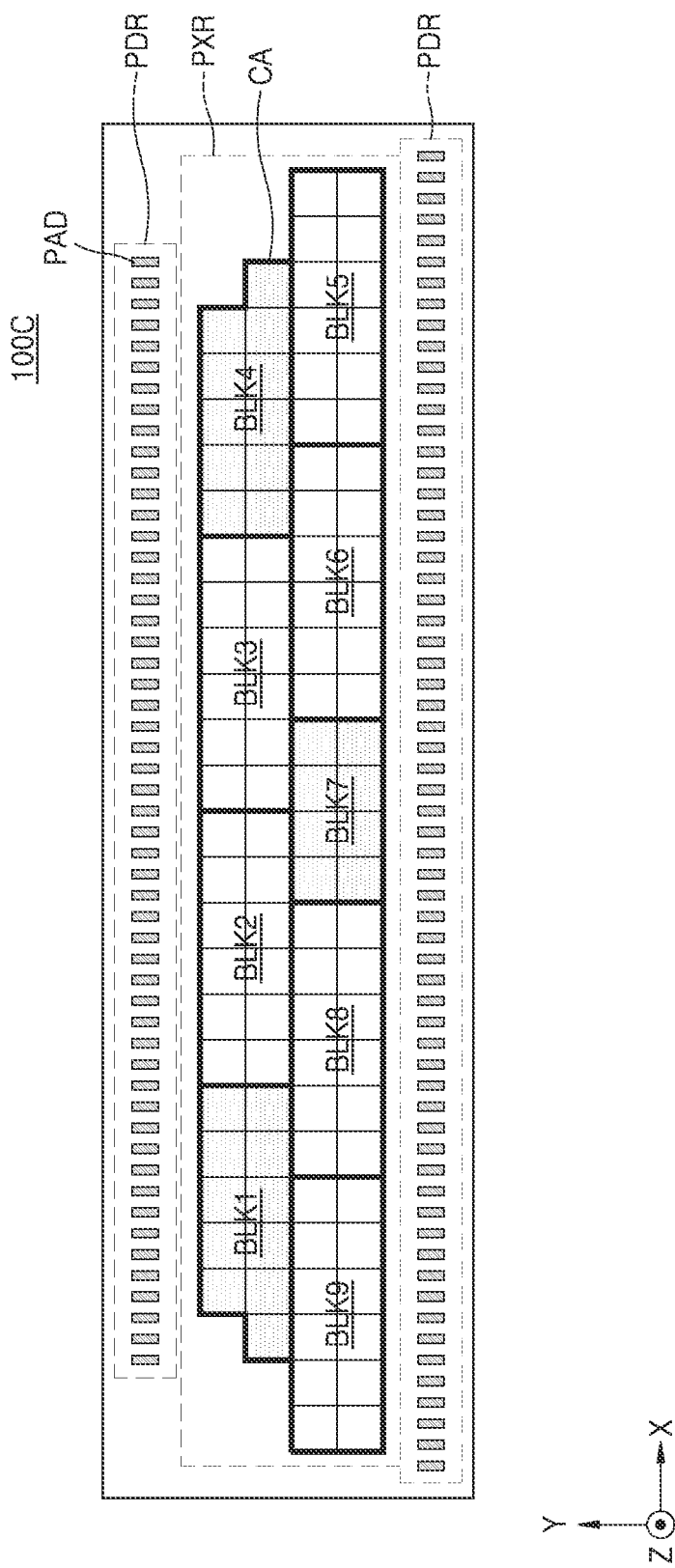
FIG. 14 is a plan view of a semiconductor light-emitting device according to an embodiment.

FIG. 14 is a plan view of a semiconductor light-emitting device 100C according to an embodiment.

Referring to FIG. 14, the semiconductor light-emitting device 100C may include a plurality of cell blocks (e.g., BLK1 to BLK9). Each of the plurality of cell blocks BLK1 to BLK9 may constitute one sub-array and include a plurality of light-emitting cells arranged in a matrix form. Although FIG. 14 illustrates nine cell blocks BLK1 to BLK9, embodiments are not limited thereto. In various embodiments, the number of cell blocks BLK1 to BLK9 may vary, and the arrangement of cell blocks BLK1 to BLK9 may also vary.

The number of light-emitting cells included in each of the plurality of cell blocks (or sub-arrays) may be variously provided in the semiconductor light-emitting device 100C, and thus, the light-emitting cells may be arranged to correspond to a light distribution type of a product provided with the semiconductor light-emitting device 100C. In an example embodiment, the semiconductor light-emitting device 100C may include a specific cell block (e.g., BLK7), which is positioned in the center of a cell array region and includes a smaller number of light-emitting cells than other cell blocks (e.g., BLK2, BLK3, BLK5, BLK6, BLK8, and BLK9). In some cases, the semiconductor light-emitting device 100C may need to irradiate light having a relatively high light intensity to a central area in front of a user in a direction in which the user travels. Accordingly, it may be advantageous to supply a relatively large current to the specific cell block (e.g., BLK7) positioned in the center of the cell array region. Because the specific cell block (e.g., BLK7) positioned in the center of the cell array region includes a relatively small number of light-emitting cells, even when the relatively large current is supplied to the specific cell block, the total power consumption caused by the specific cell block may be reduced.

Alternatively, in an example embodiment, the semiconductor light-emitting device 100C may include specific cell blocks (e.g., BLK1 and BLK4), which are positioned at upper outer portions of the cell array region and include a smaller number of light-emitting cells than other cell blocks (e.g., BLK2, BLK3, BLK5, BLK6, BLK8, and BLK9). The light-emitting device 10c may have a low need to irradiate light to upper outer areas in front of a user in a direction in which the user travels. Because the specific cell blocks (e.g., BLK1 and BLK4) positioned at the upper outer portions of the semiconductor light-emitting device 100C include the smaller number of light-emitting cells than the other cell blocks, the semiconductor light-emitting device 100C may not irradiate light to unnecessary areas.

Figure 15:
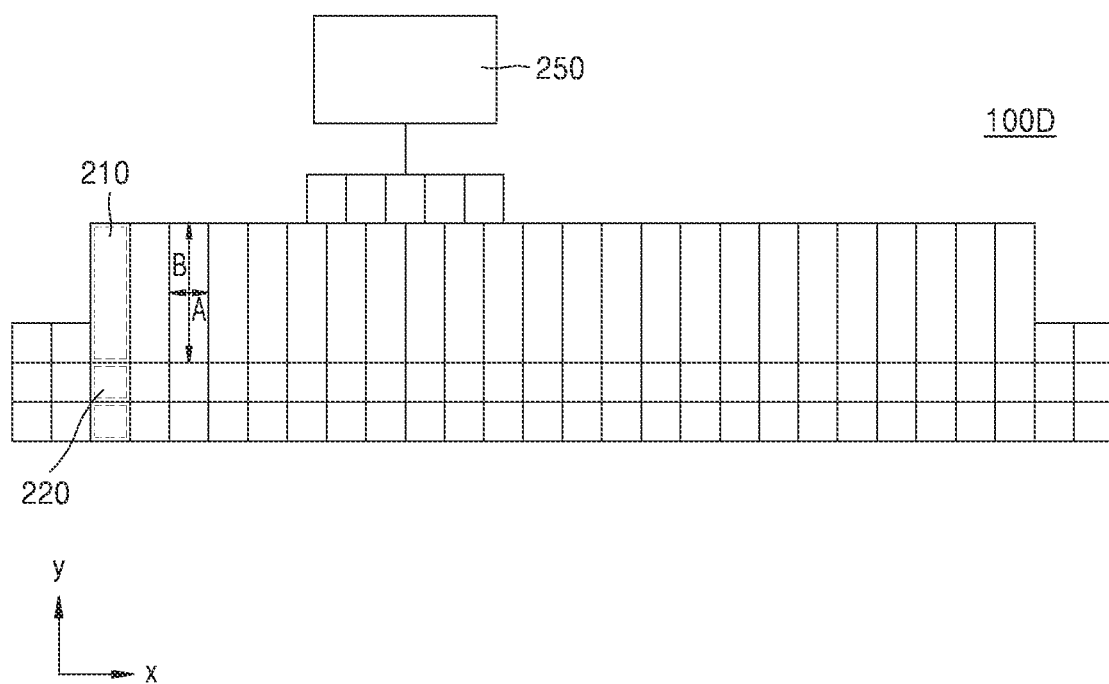
FIG. 15 is a schematic diagram of a light-emitting device according to an embodiment.

FIG. 15 is a schematic diagram of a semiconductor light-emitting device 100D according to an embodiment.

Referring to FIG. 15, the semiconductor light-emitting device 100D may include a plurality of first light-emitting regions 210. The plurality of first light-emitting regions 210 may be arranged adjacent to each other in a first direction (e.g., x direction). In some embodiments, the plurality of first light-emitting regions 210 may have substantially the same size and shape.

In addition, the semiconductor light-emitting device 100D may include a plurality of second light-emitting regions 220. The plurality of second light-emitting regions 220 may be arranged adjacent to each other in the first direction (e.g., x direction). In some embodiments, the plurality of second light-emitting regions 220 may have substantially the same size and shape.

The first light-emitting region 210 may have a dimension of A in the first direction and a dimension of B in the second direction. In this case, a ratio of A to B may be in a range of about 1:1.5 to about 1:4.5. Each of the plurality of first light-emitting regions 210 may include at least one light-emitting cell.

The semiconductor light-emitting device 100D may further include a first driver controller 250 configured to control operations of the plurality of first light-emitting regions 210. The first driver controller 250 may control on-off operations of the plurality of first light-emitting regions 210. When one first light-emitting region 210 is turned on or off via the control of the first driver controller 250, the semiconductor light-emitting device 100D may be configured such that all of at least one light-emitting cell in the one first light-emitting region 210 is substantially simultaneously turned on or off.

Figure 16:
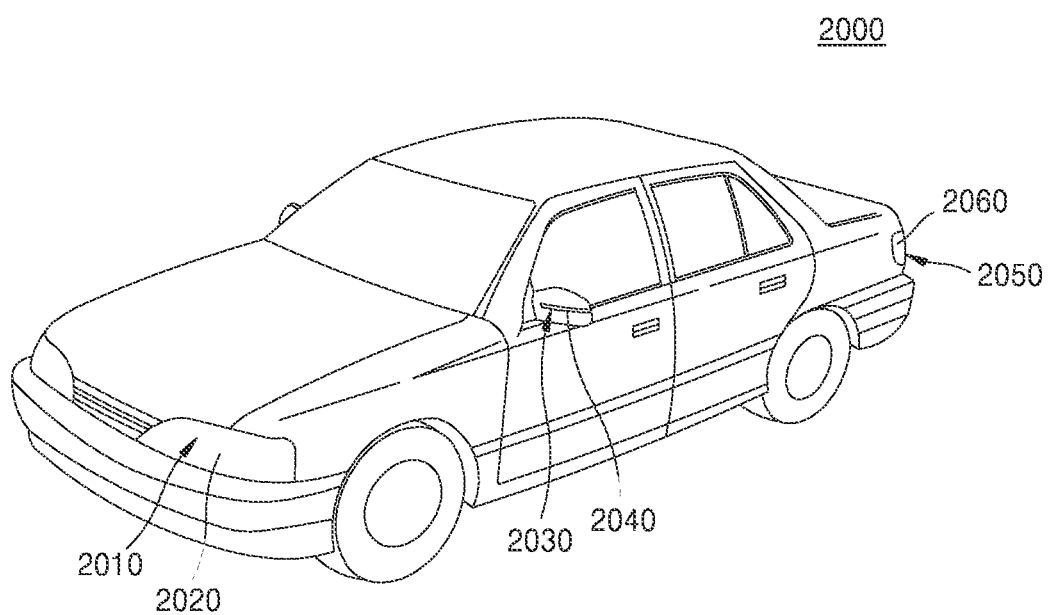
FIG. 16 is a schematic perspective view of a lighting apparatus according to an embodiment.

FIG. 16 is a schematic perspective view of a lighting apparatus 2000 according to an embodiment.

Referring to FIG. 16, the lighting apparatus 2000 may be a vehicle and may include a headlamp module 2020 installed in a headlamp unit 2010 of a vehicle. A side mirror lamp module 2040 may be installed in an outer side mirror unit 2030 of the vehicle. A tail lamp module 2060 may be installed in a tail lamp unit 2050. At least one of the headlamp module 2020, the side mirror lamp module 2040, and the tail lamp module 2060 may include the light source modules 1000 described with reference to FIGS. 10 and 11 and include at least one of the semiconductor light-emitting devices 10, 10-1, 10-2, 100, 100A, 100B, 100C, and 100D described with reference to FIGS. 1 to 15.

Figure 17:
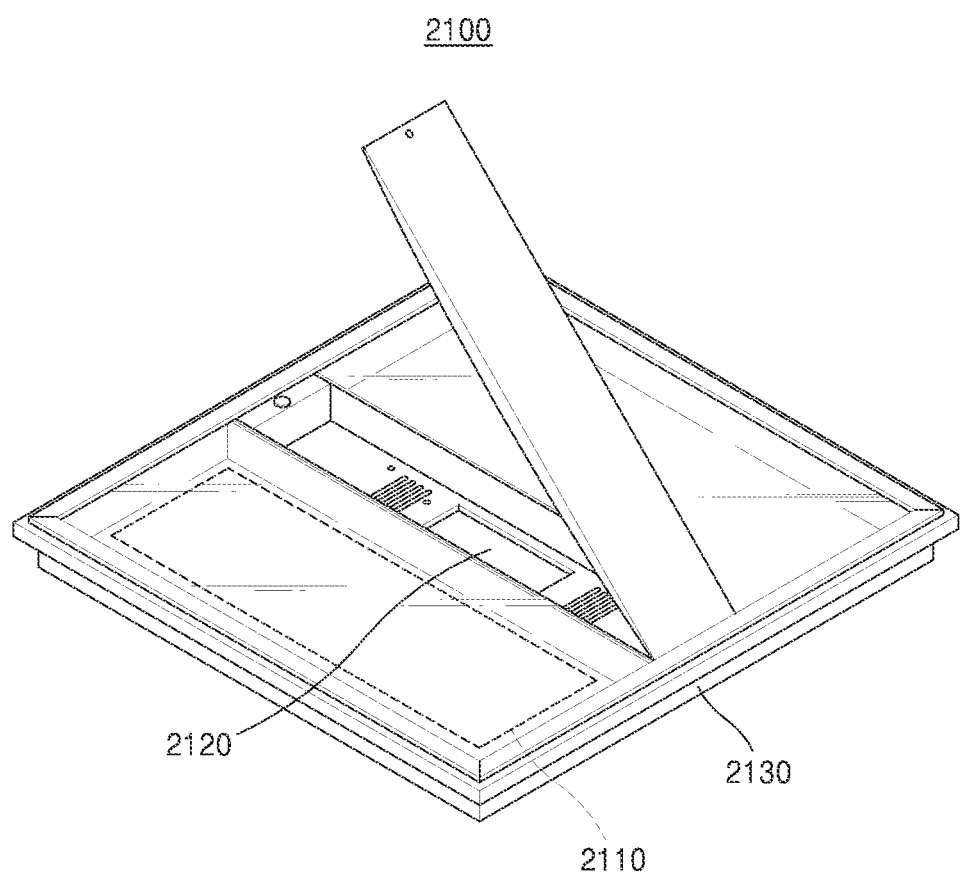
FIG. 17 is a schematic perspective view of a lighting apparatus according to an embodiment.

FIG. 17 is a schematic perspective view of a lighting apparatus 2100 according to an embodiment.

Referring to FIG. 17, the lighting apparatus 2100 may be a flat panel lighting apparatus and may include a light source module 2110, a power supply 2120, and a housing 2130. The light source module 2110 may be the light source module 1000, which has been described with reference to FIGS. 10 and 11 and include at least one of the semiconductor light-emitting devices 10, 10-1, 10-2, 100, 100A, 100B, 100C, and 100D described with reference to FIGS. 1 to 15. The light source module 2110 may have a flat shape as a whole.

The power supply 2120 may be configured to supply power to the light source module 2110. The housing 2130 may form an accommodation space for accommodating the light source module 2110 and the power supply 2120. The housing 2130 may be formed to have a hexahedral shape with one opened side, but is not limited thereto. The light source module 2110 may be positioned to emit light toward the opened side of the housing 2130.

Figure 18:
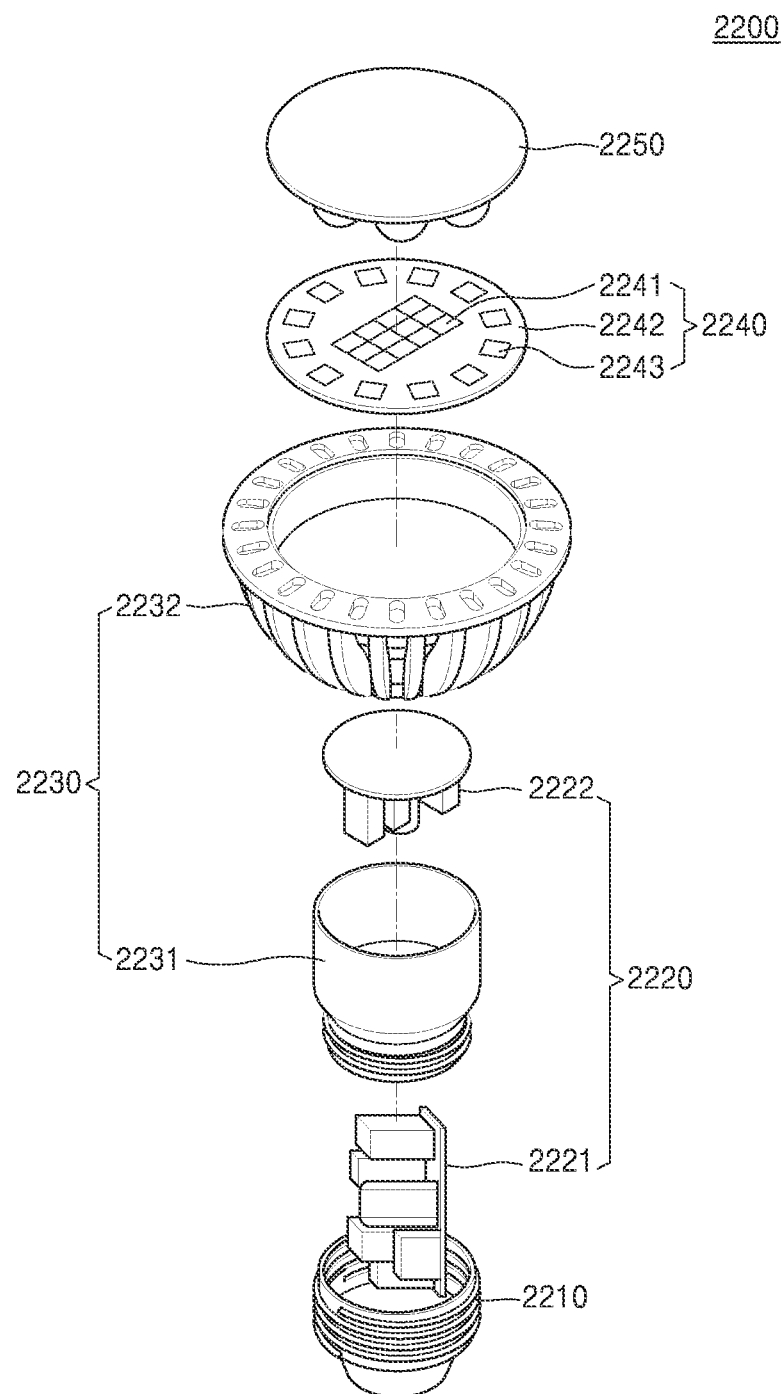
FIG. 18 is an exploded perspective view of a lighting apparatus according to an embodiment.

FIG. 18 is an exploded perspective view of a lighting apparatus 2200 according to an embodiment.

Referring to FIG. 18, the lighting apparatus 2200 may include a socket 2210, a power supply 2220, a heat sink 2230, a light source module 2240, and an optical unit 2250. The socket 2210 may be configured to be replaceable with an existing lighting apparatus. Power may be supplied to the lighting apparatus 2200 through the socket 2210. The power supply 2220 may be dissembled into a first power supply 2221 and a second power supply 2222. The heat sink 2230 may include an internal heat sink 2231 and an external heat sink 2232. The internal heat sink 2231 may be directly connected to the light source module 2240 and/or the power supply 2220 and transmit heat to the external heat sink 2232 through the light source module 2240 and/or the power supply 2220. The optical unit 2250 may include an internal optical unit (not shown) and an external optical unit (not shown). The optical unit 2250 may be configured to uniformly disperse light emitted by the light source module 2240.

The light source module 2240 may receive power from the power supply 2220 and emit light to the optical unit 2250. The light source module 2240 may include at least one light-emitting device package 2241, a circuit board 2242, and a controller 2243. The controller 2243 may store driving information of the at least one light-emitting device package 2241. The at least one light-emitting device package 2241 may include at least one of the semiconductor light-emitting devices 10, 10-1, 10-2, 100, 100A, 100B, 100C, and 100D described with reference to FIGS. 1 to 15.

Figure 19:
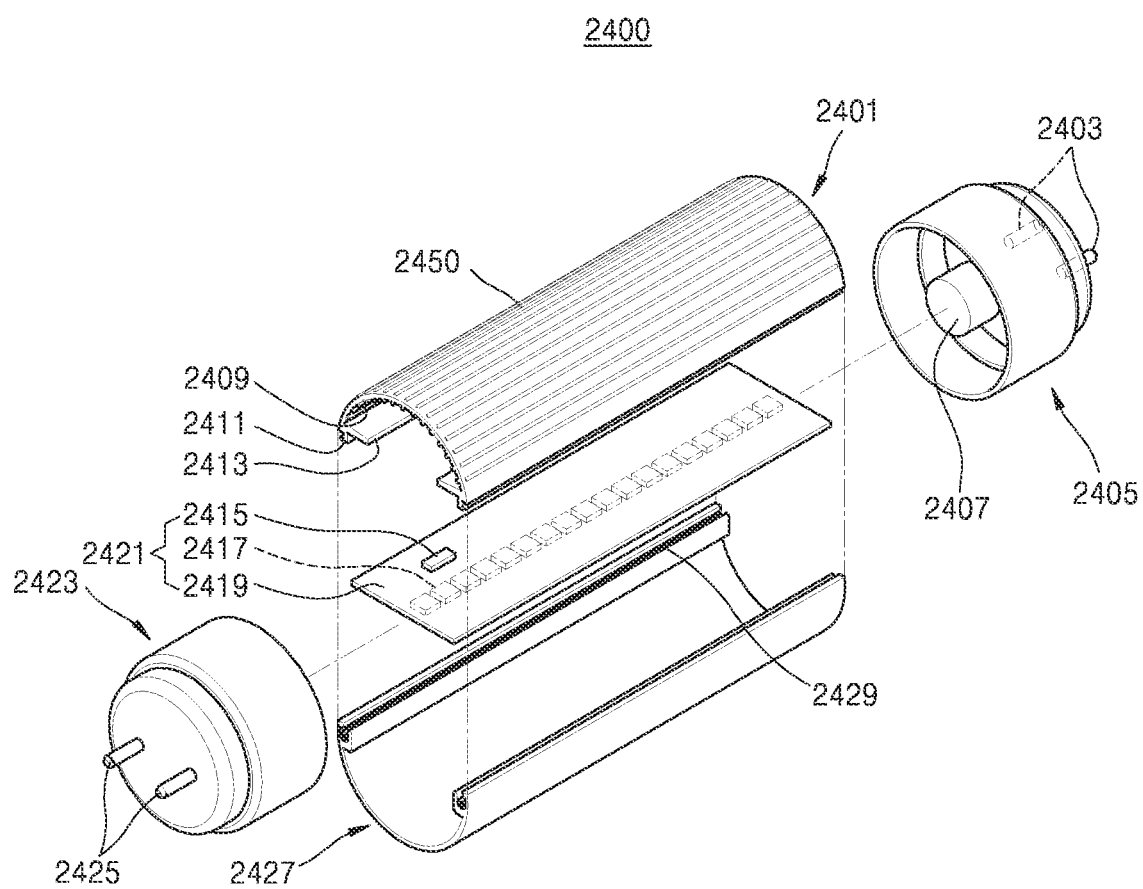
FIG. 19 is an exploded perspective view of a lighting apparatus according to an embodiment.

FIG. 19 is an exploded perspective view of a lighting apparatus 2400 according to an embodiment.

Referring to FIG. 19, the lighting apparatus 2400 may include a heat sink member 2401, a cover 2427, a light source module 2421, a first socket 2405, and a second socket 2423. A plurality of heat sink fins 2450 and 2409 having a concave/convex shape may be formed on inner or/and outer surfaces of the heat sink member 2401. The heat sink fins 2450 and 2409 may be designed to have various shapes and intervals. A support 2413 having a protruding shape may be formed inside the heat sink member 2401. The light source module 2421 may be fixed to the support 2413. Locking protrusions 2411 may be formed on both ends of the heat sink member 2401.

Locking grooves 2429 may be formed in the cover 2427. The locking protrusions 2411 of the heat sink member 2401 may be hooked to the locking grooves 2429. Positions of the locking grooves 2429 may be exchanged with positions of the locking protrusions 2411.

The light source module 2421 may include a printed circuit board (PCB) 2419, a light source 2417, and a controller 2415. The controller 2415 may store driving information of the light source 2417. Circuit wirings may be formed on the PCB 2419 so as to operate the light source 2417. In addition, the light source module 2421 may include components for operating the light source 2417. The light source 2417 may include at least one of the semiconductor light-emitting devices 10, 10-1, 10-2, 100, 100A, 100B, 100C, and 100D described with reference to FIGS. 1 to 15.

The first and second sockets 2405 and 2423 may be provided as a pair of sockets and may be connected to both ends of a cylindrical cover including the heat sink member 2401 and the cover 2427. For example, the first socket 2405 may include an electrode terminal 2403 and a power supply 2407, and the second socket 2423 may include a dummy terminal 2425. In addition, an optical sensor and/or a communication module may be embedded into any one of the first socket 2405 and the second socket 2423.

Figure 20:
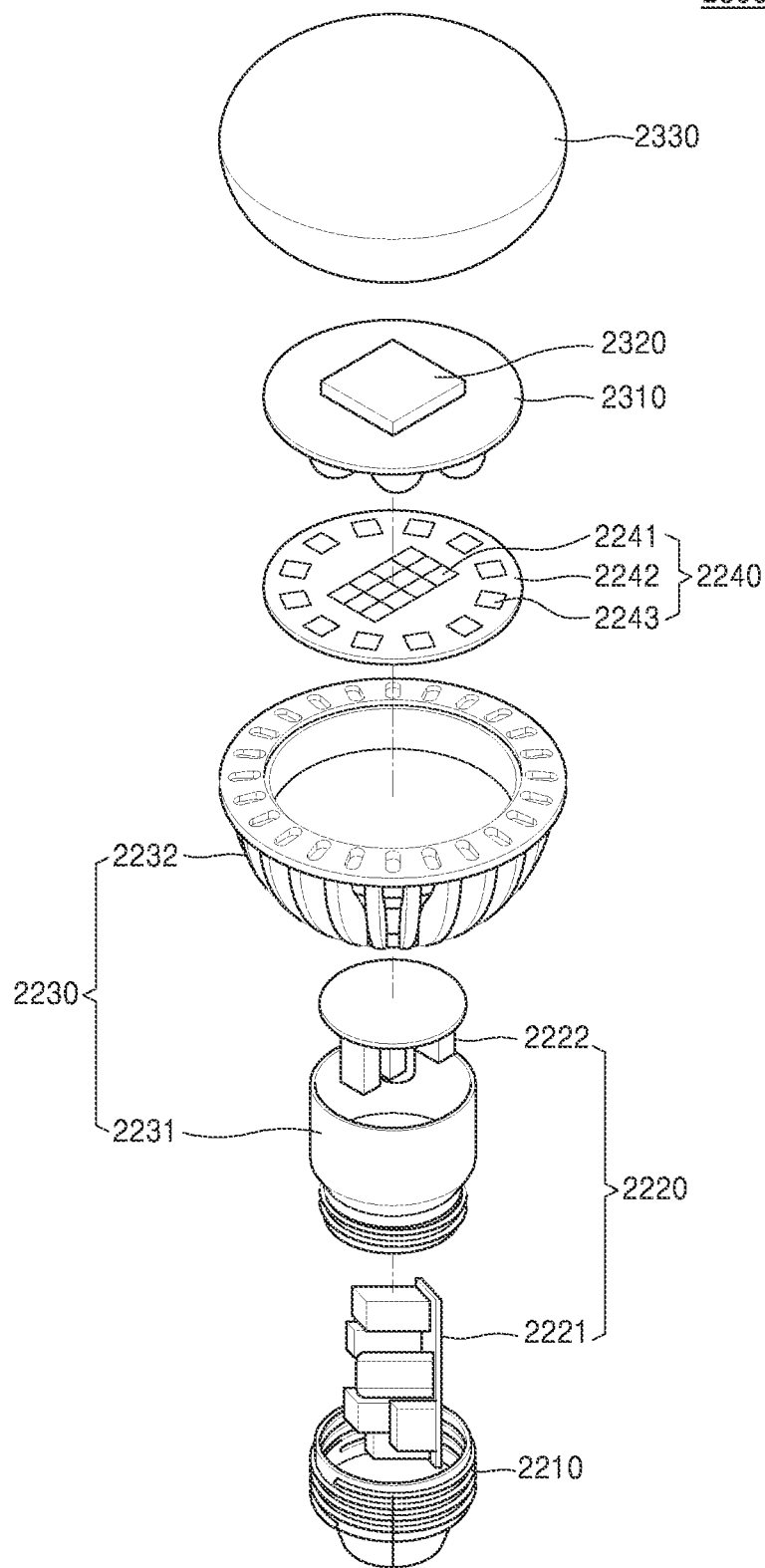
FIG. 20 is an exploded perspective view of a lighting apparatus according to an embodiment.

FIG. 20 is an exploded perspective view of a lighting apparatus 2500 according to an embodiment.

Specifically, the lighting apparatus 2500 according to the embodiment illustrated in FIG. 20 may be different from the lighting apparatus 2200 of FIG. 18 in that a reflective plate 2310 and a communication module 2320 are provided on a light source module 2240. The reflective plate 2310 may uniformly disperse light from a light source in a lateral direction and a rearward direction so as to reduce glare.

The communication module 2320 may be mounted on the reflective plate 2310. Home network communication may be implemented through the communication module 2320. For example, the communication module 2320 may be a wireless communication module using ZigBee, WiFi, or LiFi, and may control an indoor or outdoor lighting apparatus, such as on/off operations or brightness adjustment of the lighting apparatus 2500 through a smartphone or a wireless controller. Also, the communication module 2320 may control indoor or outdoor electronic appliances and vehicle systems, such as TVs, refrigerators, air conditioners, doorlock systems, and vehicles. The reflective plate 2310 and the communication module 2320 may be covered by a cover 2330. Remaining elements of the lighting apparatus 2500 are similar to like elements of the lighting apparatus 2200 and thus repeated description is omitted for conciseness.

Figure 21:
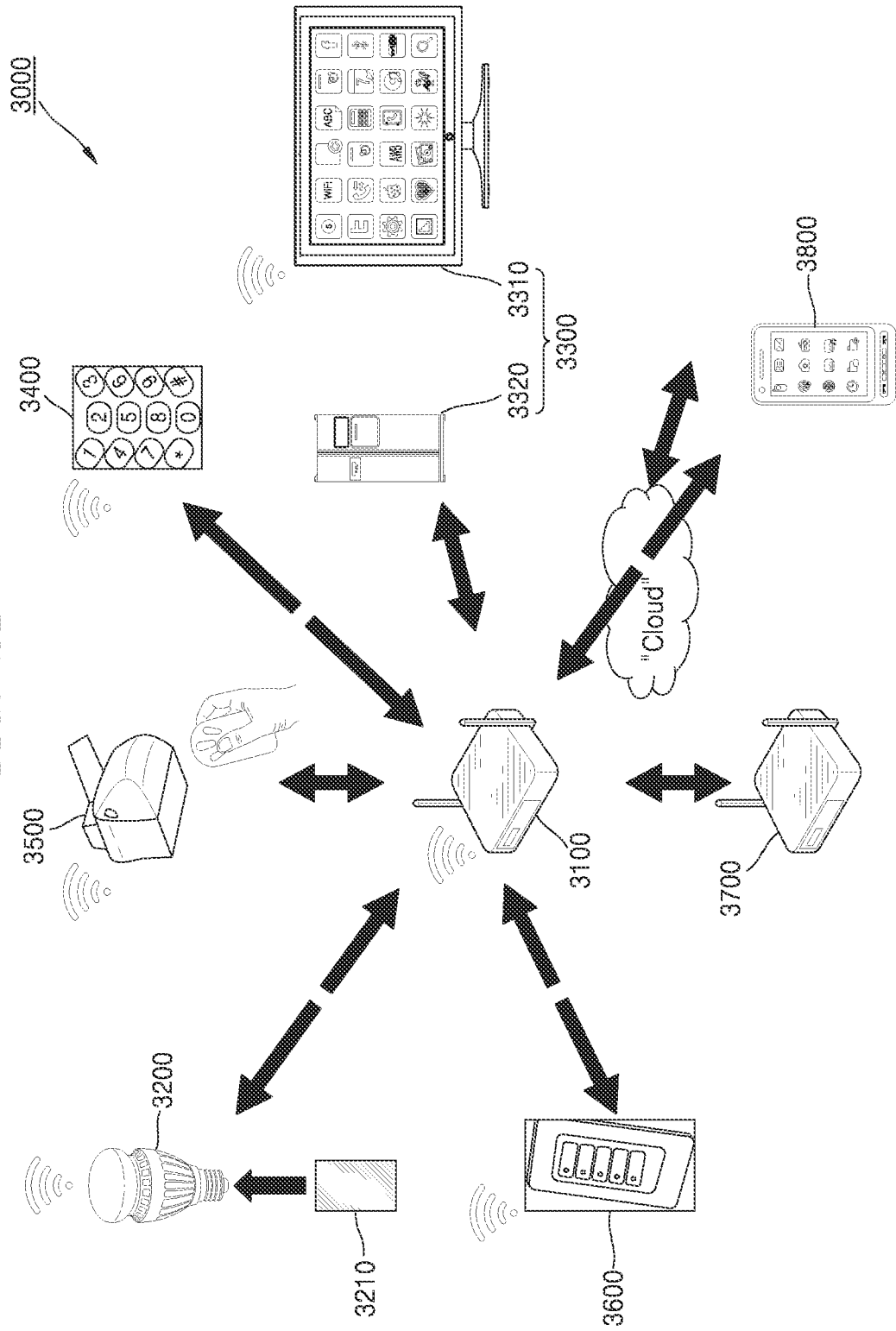
FIG. 21 is a schematic diagram for describing an indoor lighting control network system according to embodiments.

FIG. 21 is a schematic diagram for describing an indoor lighting control network system 3000 according to embodiments.

Referring to FIG. 21, the indoor lighting control network system (hereinafter, referred to as network system) 3000 may be a composite smart lighting-network system in which illumination technology using a light-emitting element, such as an LED, Internet of Things (IoT) technology, and wireless communication technology converge. The network system 3000 may be implemented using various lighting apparatuses and wired/wireless communication devices. Alternatively, the network system 3000 may be implemented based on an IoT environment so as to collect and process a variety of information and provide the information to users.

An LED lamp 3200 included in the network system 3000 may receive information about an ambient environment from a gateway 3100 and control illumination of the LED lamp 3200 itself. Furthermore, the LED lamp 3200 may check and control the operation states of other devices (e.g., 3300 to 3800) included in the IoT environment based on a visible light communication function of the LED lamp 3200. The LED lamp 3200 may include at least one of the semiconductor light-emitting devices 10, 10-1, 10-2, 100, 100A, 100B, 100C, and 100D described with reference to FIGS. 1 to 15. The LED lamp 3200 may be communicably connected to the gateway 3100 by the wireless communication protocol such as WiFi, ZigBee, or LiFi. To this end, the LED lamp 3200 may include at least one lamp communication module 3210.

In a case where the network system 3000 is applied to the home, the plurality of devices (e.g., 3300 to 3800) may include electronic appliances 3300, a digital doorlock 3400, a garage doorlock 3500, a lighting switch 3600 installed on a wall, a router 3700 for relaying a wireless communication network, and mobile devices 3800 such as smartphones, tablets, or laptop computers.

In the network system 3000, the LED lamp 3200 may check operation states of the various devices (e.g., 3300 to 3800) or automatically control the illumination of the LED lamp 3200 itself according to the ambient environment and conditions by using the wireless communication network (e.g., ZigBee, WiFi, LiFi, etc.) installed at home. In addition, the LED lamp 3200 may control the devices (e.g., 3300 to 3800) included in the network system 3000 through LiFi communication using visible light emitted by the LED lamp 3200.

To begin with, the LED lamp 3200 may automatically control the illumination of the LED lamp 3200 based on the information about the ambient environment, which is transmitted from the gateway 3100 through the at least one lamp communication module 3210, or the information about the ambient environment, which is collected from a sensor mounted on the LED lamp 3200. For example, the brightness of the LED lamp 3200 may be automatically adjusted according to a kind of a TV program aired on the TV 3310 or a screen brightness of the TV 3310. To this end, the LED lamp 3200 may receive operation information of the TV 3310 from the at least one lamp communication module 3210 connected to the gateway 3100. The at least one lamp communication module 3210 may be integrally modularized with a sensor and/or a controller included in the LED lamp 3200.

For example, after elapse of a predetermined time after the digital doorlock 3400 has been locked in such a state that there is no person at home, it is possible to prevent waste of electricity by turning off the turned-on LED lamp 3200. Alternatively, in a case where a security mode is set through the mobile device 3800 or the like, when the digital doorlock 3400 is locked in such a state that there is no person at home, the LED lamp 3200 may be maintained in the turned-on state.

The operation of the LED lamp 3200 may be controlled according to information about the ambient environment, which is collected through various sensors connected to the network system 3000. For example, in a case where the network system 3000 is implemented in a building, it is possible to turn on or off the illumination by combining a lighting apparatus, a position sensor, and a communication module within the building, or provide collected information in real time, thus enabling efficient facility management or efficient utilization of unused space.

Figure 22:
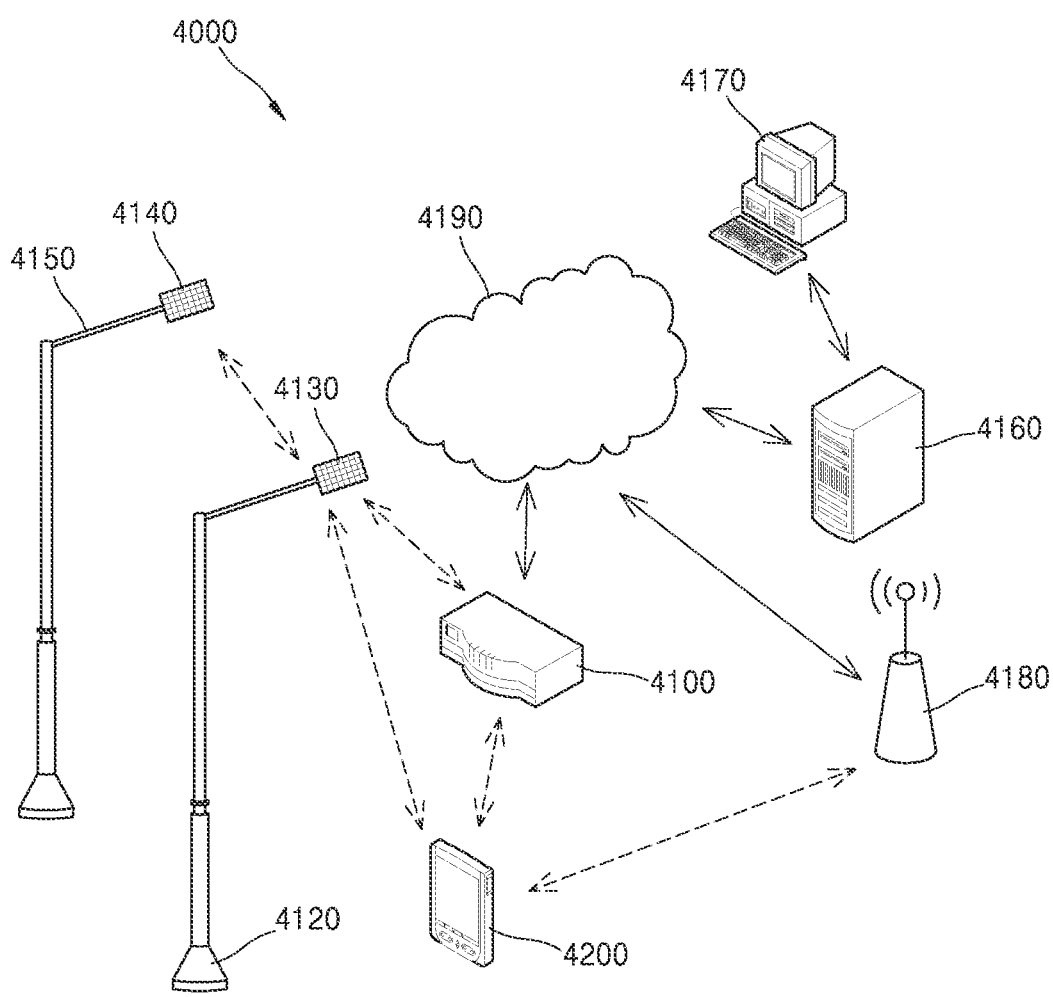
FIG. 22 is a schematic diagram for describing a network system according to an embodiment.

FIG. 22 is a schematic diagram for describing a network system 4000 according to an embodiment.

Specifically, FIG. 22 illustrates the network system 4000 applied to an open space, according to an embodiment. The network system 4000 may include a communication connecting device 4100, a plurality of lighting apparatuses (e.g., 4120 and 4150) installed at predetermined intervals and communicably connected to the communication connecting device 4100, a server 4160, a computer 4170 configured to manage the server 4160, a communication base station 4180, a communication network 4190 configured to connect communicable devices, and a mobile device 4200.

The plurality of lighting apparatuses 4120 and 4150 installed in open external spaces such as streets or parks may include smart engines 4130 and 4140, respectively. Each of the smart engines 4130 and 4140 may include a light-emitting device configured to emit light, a driver configured to drive the light-emitting device, a sensor configured to collect information about an ambient environment, and a communication module. The light-emitting device included in each of the smart engines 4130 and 4140 may include the semiconductor light-emitting devices 10, 10-1, 10-2, 100, 100A, 100B, 100C, and 100D described with reference to FIGS. 1 to 15.

The communication module may enable the smart engines 4130 and 4140 to communicate with other peripheral devices in accordance with a communication protocol such as WiFi, ZigBee, or LiFi. One smart engine 4130 may be communicably connected to the other smart engine 4140. In this case, a WiFi mesh may be applied to the communication between the smart engines 4130 and 4140. At least one smart engine 4130 may be connected to the communication connecting device 4100 connected to the communication network 4190 by a wired/wireless communication.

The communication connecting device 4100 may be an access point (AP) capable of performing wired/wireless communications and may relay a communication between the communication network 4190 and other devices. The communication connecting device 4100 may be connected to the communication network 4190 by at least one of the wired/wireless communication schemes. For example, the communication connecting device 4100 may be mechanically accommodated in one of the lighting apparatuses 4120 and 4150.

The communication connecting device 4100 may be connected to the mobile device 4200 through a communication protocol such as WiFi. A user of the mobile device 4200 may receive information about the ambient environment, which is collected by a plurality of smart engines (e.g., 4130 and 4140), through the communication connecting device 4100 connected to the smart engine 4130 of an adjacent lighting apparatus 4120. The information about the ambient environment may include neighboring traffic information, weather information, and the like. The mobile device 4200 may be connected to the communication network 4190 through the communication base station 4180 by a wireless cellular communication scheme such as a 3G or 4G communication scheme.

Moreover, the server 4160 connected to the communication network 4190 may receive information collected by the smart engines 4130 and 4140 respectively mounted on the lighting apparatuses 4120 and 4150 and may monitor the operation states of the lighting apparatuses 4120 and 4150. The server 4160 may be connected to the computer 4170 that provides a management system, and the computer 4170 may execute software capable of monitoring and managing the operation states of the smart engines 4130 and 4140.

Figure 23:
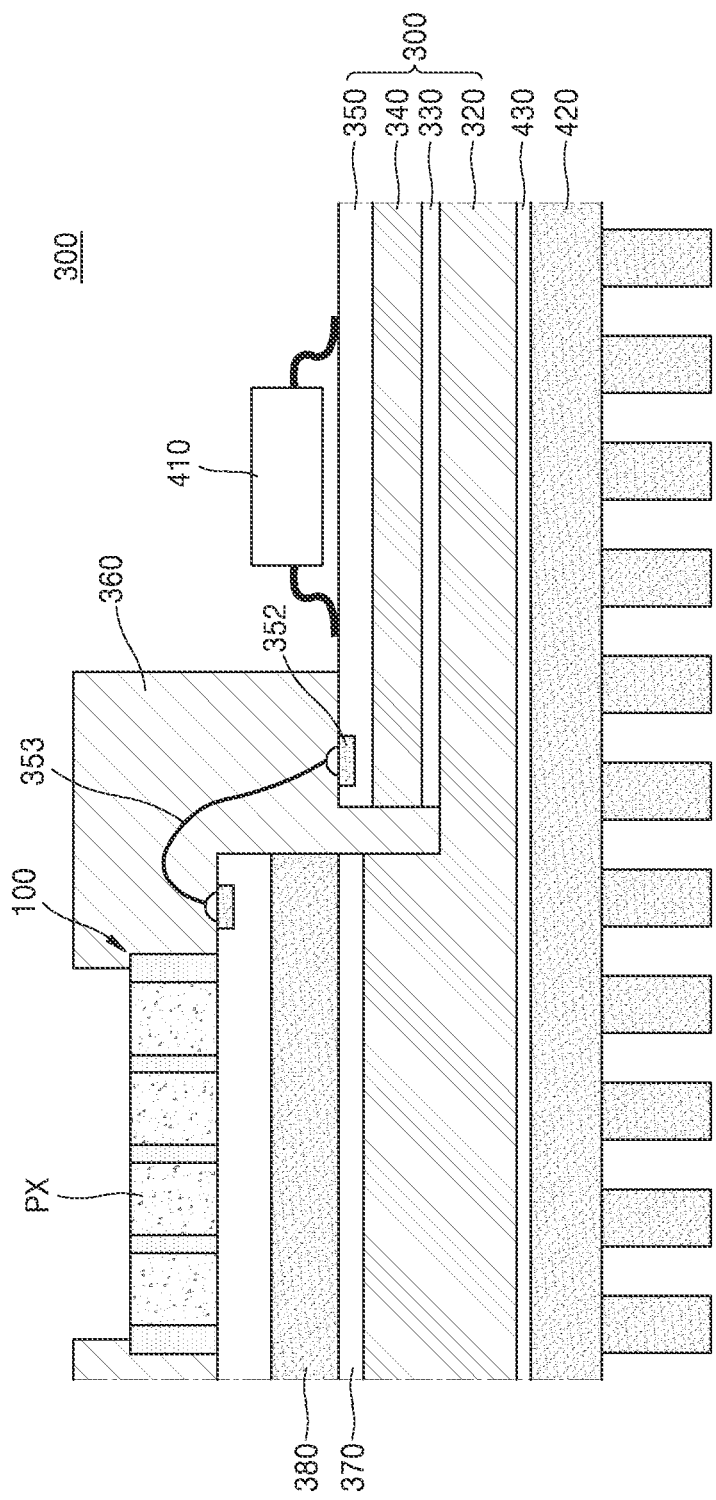
FIG. 23 is a cross-sectional view of a light-emitting package including a light-emitting device, according to embodiments.

FIG. 23 is a cross-sectional view of a light-emitting package 300 including a semiconductor light-emitting device 100, according to an embodiment. In FIG. 23, the same reference numerals are used to denote the same elements as in FIGS. 1 to 22, and repeated description thereof is omitted for conciseness.

Referring to FIG. 23, the light-emitting package 300 may include the semiconductor light-emitting device 100 and a at least one semiconductor driving chip 410, which are mounted on a package substrate 310.

A lower insulating layer 330, an inner conductive pattern layer 340, and an upper insulating layer 350 may be sequentially stacked on a partial region of a base plate 320, and at least one semiconductor driving chip 410 may be mounted on a conductive pattern (not shown) positioned on the upper insulating layer 350.

An interposer 380 may be positioned on another region of the base plate 320 with an adhesive layer 370 therebetween, and the semiconductor light-emitting device 100 may be mounted on the interposer 380. In example embodiments, the interposer 380 may be the same as the support substrate (refer to 154 in FIG. 7) included in the semiconductor light-emitting device 100, but is not limited thereto. The at least one semiconductor driving chip 410 may be electrically connected to the semiconductor light-emitting device 100 through a bonding wire 353 connected to a pad 352. The at least one semiconductor driving chip 410 may individually or entirely drive a plurality of pixels PX of the semiconductor light-emitting device 100.

The bonding wire 353 may be encapsulated by a molding resin 360. The molding resin 360 may include, for example, an epoxy molding compound (EMC), but is not specifically limited. The molding resin 360 may partially encapsulate the semiconductor light-emitting device 100 so as not to interfere with light emitted from the plurality of pixels PX of the semiconductor light-emitting device 100.

A heat sink 420 may be adhered onto a bottom surface of the base plate 320, and a TIM layer 430 may be selectively further interposed between the heat sink 420 and base plate 320.

The semiconductor light-emitting device 100 illustrated in FIG. 23 may include at least one of the semiconductor light-emitting devices 10, 10-1, 10-2, 100, 100A, 100B, 100C, and 100D and/or the light source module 1000 and may be mounted alone or in combination in the light-emitting package 300.

While various embodiments have been particularly shown and described herein, it will be understood that various changes in form and details may be made therein without departing from the spirit and scope of the following claims.

What is claimed is:

1. A semiconductor light-emitting device comprising:
   a buffer structure;
   a first-type semiconductor layer on the buffer structure;
   an active layer on the first-type semiconductor layer; and
   a second-type semiconductor layer on the active layer,
   wherein the buffer structure comprises a nucleation layer, a first dislocation-removing structure on the nucleation layer, and a buffer layer on the first dislocation-removing structure,
   the first dislocation-removing structure comprises a first material layer on the nucleation layer and a second material layer on the first material layer, the second material layer having a lattice constant different from a lattice constant of the first material layer,
   a roughness of a surface of the first material layer in contact with the second material layer is higher than a roughness of a surface of the nucleation layer in contact with the first material layer and higher than a roughness of a surface of the second material layer in contact with the buffer layer, and
   a lattice constant of the buffer layer is between the lattice constant of the second material layer and a lattice constant of the first-type semiconductor layer.

2. The semiconductor light-emitting device of claim 1, wherein a material of the first material layer comprises a same material as a material of the buffer layer.

3. The semiconductor light-emitting device of claim 2, wherein the first material layer and the buffer layer comprise $B_xAl_yIn_zGa_{1-x-y-z}N$,
   wherein $0 \leq x < 1$, $0 \leq y < 1$, $0 \leq z < 1$, and $0 \leq x+y+z < 1$.

4. The semiconductor light-emitting device of claim 1, wherein a material of the second material layer comprises a same material as a material of the nucleation layer.

5. The semiconductor light-emitting device of claim 4, wherein the second material layer and the nucleation layer comprise aluminum nitride (AlN).

6. The semiconductor light-emitting device of claim 1, wherein the lattice constant of the second material layer is lower than the lattice constant of the first material layer, and
   a thickness of the second material layer is less than a thickness of the nucleation layer.

7. The semiconductor light-emitting device of claim 1, wherein a thickness of the second material layer is from about 10% to about 50% of a thickness of the first material layer.

8. The semiconductor light-emitting device of claim 1, wherein at least one of the nucleation layer, the first material layer, the second material layer, and the buffer layer is doped with silicon (Si).

9. The semiconductor light-emitting device of claim 1, wherein the buffer structure further comprises a second dislocation-removing structure between the first dislocation-removing structure and the buffer layer,
   the second dislocation-removing structure comprises a third material layer between the second material layer and the buffer layer and a fourth material layer between the third material layer and the buffer layer, the fourth material layer having a lattice constant different from a lattice constant of the third material layer,
   a roughness of a surface of the third material layer in contact with the fourth material layer is higher than the roughness of the surface of the second material layer in contact with the third material layer and higher than a roughness of a surface of the fourth material layer in contact with the buffer layer, and
   the lattice constant of the buffer layer is between the lattice constant of the fourth material layer and the lattice constant of the first-type semiconductor layer.

10. The semiconductor light-emitting device of claim 9, wherein the roughness of the surface of the third material layer in contact with the fourth material layer is lower than the roughness of the surface of the first material layer in contact with the second material layer.

* * * * *